United States Patent
Yasuda et al.

(10) Patent No.: US 10,950,702 B2
(45) Date of Patent: Mar. 16, 2021

(54) SEMICONDUCTOR DEVICE, SEMICONDUCTOR MODULE, AND PACKAGED SEMICONDUCTOR DEVICE

(71) Applicant: PANASONIC SEMICONDUCTOR SOLUTIONS CO., LTD., Kyoto (JP)

(72) Inventors: Eiji Yasuda, Osaka (JP); Toshikazu Imai, Hyogo (JP); Ryosuke Okawa, Nara (JP); Takeshi Imamura, Kyoto (JP); Mitsuaki Sakamoto, Kyoto (JP); Kazuma Yoshida, Kyoto (JP); Masaaki Hirako, Shiga (JP); Yasuyuki Masumoto, Osaka (JP); Shigetoshi Sota, Kyoto (JP); Tomonari Oota, Kyoto (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 0 days.

(21) Appl. No.: 17/075,290

(22) Filed: Oct. 20, 2020

(65) Prior Publication Data

US 2021/0036114 A1  Feb. 4, 2021

Related U.S. Application Data

(60) Division of application No. 16/261,232, filed on Jan. 29, 2019, which is a continuation of application No. PCT/JP2017/027829, filed on Aug. 1, 2017.

(Continued)

(51) Int. Cl.
*H01L 29/417* (2006.01)
*H01L 21/3205* (2006.01)
(Continued)

(52) U.S. Cl.
CPC .... *H01L 29/41741* (2013.01); *H01L 21/3205* (2013.01); *H01L 21/768* (2013.01);
(Continued)

(58) Field of Classification Search
CPC .......... H01L 29/41741; H01L 21/3205; H01L 21/768
See application file for complete search history.

(56) References Cited

U.S. PATENT DOCUMENTS

2006/0118866 A1  6/2006  Yanagida et al.
2010/0013008 A1  1/2010  Oikawa
(Continued)

FOREIGN PATENT DOCUMENTS

JP  2002-368217 A  12/2002
JP  2006-147700 A  6/2006
(Continued)

OTHER PUBLICATIONS

International Search Report and Written Opinion issued in International Patent Application No. PCT/JP2017/027829, dated Oct. 24, 2017; with partial English translation.

*Primary Examiner* — Seahvosh Nikmanesh
(74) *Attorney, Agent, or Firm* — McDermott Will and Emery LLP

(57) ABSTRACT

A semiconductor device includes a semiconductor substrate including a first conductivity-type impurity, a low-concentration impurity layer including a first conductivity-type impurity having a concentration lower than a concentration of the first conductivity-type impurity in the semiconductor substrate, a backside electrode including a metal material, and first and second transistors in the low-concentration impurity layer. The first transistor includes a first source electrode and a first gate electrode on a surface of the low-concentration impurity layer, the second transistor (Continued)

includes a second source electrode and a second gate electrode on the surface of the low-concentration impurity layer. The semiconductor substrate serves as a common drain region of the transistors. The thickness of the backside electrode ranges from 25 to 35 µm, and the ratio of the thickness of the backside electrode to the thickness of a semiconductor layer including the semiconductor substrate and the low-concentration impurity layer is 0.32 or more.

7 Claims, 11 Drawing Sheets

Related U.S. Application Data

(60) Provisional application No. 62/369,921, filed on Aug. 2, 2016.

(51) Int. Cl.
| | | |
|---|---|---|
| *H01L 21/768* | (2006.01) | |
| *H01L 21/8234* | (2006.01) | |
| *H01L 25/18* | (2006.01) | |
| *H02J 7/00* | (2006.01) | |
| *H01L 23/522* | (2006.01) | |
| *H01L 29/78* | (2006.01) | |
| *H01L 25/07* | (2006.01) | |
| *H01L 23/13* | (2006.01) | |
| *H01L 23/498* | (2006.01) | |
| *H01L 23/00* | (2006.01) | |
| *H01L 29/36* | (2006.01) | |
| *H01L 29/45* | (2006.01) | |
| *H01L 27/088* | (2006.01) | |
| *H01L 23/31* | (2006.01) | |

(52) U.S. Cl.
CPC ........ *H01L 21/823475* (2013.01); *H01L 21/823487* (2013.01); *H01L 23/13* (2013.01); *H01L 23/49838* (2013.01); *H01L 23/522* (2013.01); *H01L 24/06* (2013.01); *H01L 25/07* (2013.01); *H01L 25/18* (2013.01); *H01L 27/088* (2013.01); *H01L 29/36* (2013.01); *H01L 29/41775* (2013.01); *H01L 29/456* (2013.01); *H01L 29/7813* (2013.01); *H01L 29/7827* (2013.01); *H02J 7/0031* (2013.01); *H01L 23/3114* (2013.01); *H01L 2224/05144* (2013.01); *H01L 2224/05155* (2013.01); *H01L 2224/05164* (2013.01); *H01L 2224/05166* (2013.01); *H01L 2224/05184* (2013.01); *H01L 2224/0603* (2013.01); *H01L 2224/06151* (2013.01); *H01L 2924/2064* (2013.01); *H01L 2924/3511* (2013.01); *H02J 7/0068* (2013.01)

(56) References Cited

U.S. PATENT DOCUMENTS

| | | |
|---|---|---|
| 2010/0044873 A1 | 2/2010 | Kameyama |
| 2011/0147814 A1 | 6/2011 | Yamasaki |

FOREIGN PATENT DOCUMENTS

| | | |
|---|---|---|
| JP | 2010-092895 A | 4/2010 |
| JP | 2011-151350 A | 8/2011 |
| JP | 2014-157888 A | 8/2014 |
| JP | 2016-086006 A | 5/2016 |

FIG. 3

| | MODEL | A | B | C |
|---|---|---|---|---|
| PRODUCT SPECIFICATIONS | BVSS | 12 V | 20 V | 12 V |
| | R max | 2.85 mΩ | | 1.95 mΩ |
| | R typ | 2.19 - 2.38 mΩ | | 1.50 - 1.63 mΩ |
| | W max | 40 μm | | |
| | EPI THICKNESS (c) | 2.18 μm | 2.75 μm | 2.18 μm |
| | Ag THICKNESS (a) | | 30 μm | |
| | Si THICKNESS (a) | 43 μm | 78 μm | 43 μm |
| | RATIO Q (a/b) | 0.70 | 0.38 | 0.70 |
| | PACKAGE SIZE | 1.96 × 1.84 mm = 3.61 mm² | 1.96 × 3.40 mm = 6.67 mm² | 1.96 × 3.05 mm = 5.98 mm² |
| | DIAGONAL LENGTH (L) | 2.69 mm | 3.92 mm | 3.63 mm |
| DESIGN EXAMPLE | CHIP GENERAL VIEW ⬭: S PAD ⊗: G PAD | | | |
| | G PAD DISPOSITION | TO CENTER WITH RESPECT TO CHIP LONG SIDE | TO END WITH RESPECT TO CHIP LONG SIDE | TO END WITH RESPECT TO CHIP LONG SIDE |
| | S PAD DISPOSITION | SEPARATED INTO TWO SECTIONS ALONG TRANSISTOR BOUNDARY | CLOSE TO TRANSISTOR BOUNDARY IN ENTIRE RANGE | CLOSE TO TRANSISTOR BOUNDARY IN ENTIRE RANGE |

FIG. 4A

| MODEL A | | | | c = 2.18 [μm]   L = 2.69 [mm] | | | | | | | |
|---|---|---|---|---|---|---|---|---|---|---|---|
| a = 25 [μm] | | | | a = 30 [μm] | | | | a = 35 [μm] | | | |
| b [μm] | Q (a/b) | R [mΩ] | W [μm] | b [μm] | Q (a/b) | R [mΩ] | W [μm] | b [μm] | Q (a/b) | R [mΩ] | W [μm] |
| 28 | 0.89 | 2.22 | 20.1 | 28 | 1.07 | 2.19 | 19.7 | 28 | 1.25 | 2.16 | 18.9 |
| 33 | 0.76 | 2.28 | 18.2 | 33 | 0.91 | 2.25 | 18.2 | 33 | 1.06 | 2.22 | 17.8 |
| 38 | 0.66 | 2.33 | 16.4 | 38 | 0.79 | 2.30 | 16.7 | 38 | 0.92 | 2.28 | 16.6 |
| 43 | 0.58 | 2.39 | 14.8 | 43 | 0.70 | 2.36 | 15.3 | 43 | 0.81 | 2.34 | 15.4 |
| 48 | 0.52 | 2.44 | 13.4 | 48 | 0.63 | 2.41 | 14.0 | 48 | 0.73 | 2.39 | 14.2 |
| 58 | 0.43 | - | 11.0 | 58 | 0.52 | - | 11.8 | 58 | 0.60 | - | 12.2 |
| 68 | 0.37 | 2.65 | 9.1 | 68 | 0.44 | 2.62 | 9.9 | 68 | 0.51 | 2.60 | 10.4 |
| 73 | 0.34 | 2.70 | 8.3 | 73 | 0.41 | 2.67 | 9.2 | 73 | 0.48 | 2.65 | 9.7 |
| 78 | 0.32 | - | 7.7 | 78 | 0.38 | - | 8.5 | 78 | 0.45 | - | 9.0 |
| 83 | 0.30 | - | 7.1 | 83 | 0.36 | - | 7.8 | 83 | 0.42 | - | 8.4 |
| 93 | 0.27 | - | 6.0 | 93 | 0.32 | - | 6.8 | 93 | 0.38 | - | 7.3 |

FIG. 4B

| MODEL B | | | | c = 2.75 [μm]   L = 3.92 [mm] | | | | | | | |
|---|---|---|---|---|---|---|---|---|---|---|---|
| a = 25 [μm] | | | | a = 30 [μm] | | | | a = 35 [μm] | | | |
| b [μm] | Q (a/b) | R [mΩ] | W [μm] | b [μm] | Q (a/b) | R [mΩ] | W [μm] | b [μm] | Q (a/b) | R [mΩ] | W [μm] |
| 28 | 0.89 | - | 55.5 | 28 | 1.07 | - | 55.4 | 28 | 1.25 | - | 53.9 |
| 33 | 0.76 | 2.02 | 51.2 | 33 | 0.91 | 1.97 | 52.2 | 33 | 1.06 | 1.93 | 51.6 |
| 33 | 0.76 | - | 50.3 | 33 | 0.91 | - | 51.3 | 33 | 1.06 | - | 50.7 |
| 38 | 0.66 | 2.06 | 45.5 | 38 | 0.79 | 2.00 | 47.2 | 38 | 0.92 | 1.96 | 47.3 |
| 43 | 0.58 | 2.08 | 41.9 | 43 | 0.70 | 2.03 | 44.0 | 43 | 0.81 | 1.99 | 44.8 |
| 43 | 0.58 | 2.09 | 41.1 | 43 | 0.70 | 2.03 | 43.3 | 43 | 0.81 | 1.99 | 44.0 |
| 48 | 0.52 | 2.11 | 37.2 | 48 | 0.63 | 2.06 | 39.7 | 48 | 0.73 | 2.02 | 40.8 |
| 53 | 0.47 | 2.14 | 34.3 | 53 | 0.57 | 2.08 | 37.0 | 53 | 0.66 | 2.04 | 38.3 |
| 58 | 0.43 | - | 30.6 | 58 | 0.52 | - | 33.3 | 58 | 0.60 | - | 35.0 |
| 63 | 0.40 | 2.19 | 28.4 | 63 | 0.48 | 2.14 | 31.2 | 63 | 0.56 | 2.10 | 33.0 |
| 68 | 0.37 | 2.22 | 25.5 | 68 | 0.44 | 2.17 | 28.3 | 68 | 0.51 | 2.13 | 30.1 |
| 73 | 0.34 | 2.24 | 23.8 | 73 | 0.41 | 2.19 | 26.6 | 73 | 0.48 | 2.15 | 28.5 |
| 73 | 0.34 | 2.25 | 23.4 | 73 | 0.41 | 2.19 | 26.1 | 73 | 0.48 | 2.15 | 28.1 |
| 78 | 0.32 | 2.28 | 21.5 | 78 | 0.38 | 2.22 | 24.2 | 78 | 0.45 | 2.18 | 26.1 |
| 78 | 0.32 | 2.27 | 21.9 | 78 | 0.38 | 2.22 | 24.6 | 78 | 0.45 | 2.18 | 26.5 |
| 83 | 0.30 | 2.30 | 20.2 | 83 | 0.36 | 2.24 | 22.8 | 83 | 0.42 | 2.20 | 24.8 |
| 83 | 0.30 | 2.35 | 19.8 | 83 | 0.36 | 2.30 | 22.4 | 83 | 0.42 | 2.26 | 24.3 |
| 93 | 0.27 | 2.35 | 17.3 | 93 | 0.32 | 2.30 | 19.7 | 93 | 0.38 | 2.26 | 21.6 |
| 93 | 0.27 | - | 17.0 | 93 | 0.32 | - | 19.4 | 93 | 0.38 | - | 21.3 |

FIG. 4C

| MODEL C | | | | c = 2.18 [μm]   L = 3.63 [mm] | | | | | | | |
|---|---|---|---|---|---|---|---|---|---|---|---|
| a = 25 [μm] | | | | a = 30 [μm] | | | | a = 35 [μm] | | | |
| b [μm] | Q (a/b) | R [mΩ] | W [μm] | b [μm] | Q (a/b) | R [mΩ] | W [μm] | b [μm] | Q (a/b) | R [mΩ] | W [μm] |
| 28 | 0.89 | - | 46.7 | 28 | 1.07 | - | 46.3 | 28 | 1.25 | - | 44.8 |
| 33 | 0.76 | - | 42.4 | 33 | 0.91 | - | 42.9 | 33 | 1.06 | - | 42.2 |
| 38 | 0.66 | 1.35 | 38.3 | 38 | 0.79 | 1.30 | 39.4 | 38 | 0.92 | 1.27 | 39.3 |
| 43 | 0.58 | 1.38 | 34.6 | 43 | 0.70 | 1.34 | 36.1 | 43 | 0.81 | 1.30 | 36.5 |
| 48 | 0.52 | 1.41 | 31.3 | 48 | 0.63 | 1.37 | 33.1 | 48 | 0.73 | 1.33 | 33.8 |
| 58 | 0.43 | - | 25.7 | 58 | 0.52 | - | 27.8 | 58 | 0.60 | - | 29.0 |
| 68 | 0.37 | 1.54 | 21.4 | 68 | 0.44 | 1.49 | 23.5 | 68 | 0.51 | 1.46 | 24.9 |
| 73 | 0.34 | 1.57 | 19.6 | 73 | 0.41 | 1.52 | 21.7 | 73 | 0.48 | 1.49 | 23.2 |
| 78 | 0.32 | 1.60 | 18.0 | 78 | 0.38 | 1.55 | 20.1 | 78 | 0.45 | 1.51 | 21.6 |
| 83 | 0.30 | - | 16.6 | 83 | 0.36 | - | 18.6 | 83 | 0.42 | - | 20.1 |
| 93 | 0.27 | 1.68 | 14.2 | 93 | 0.32 | 1.63 | 16.1 | 93 | 0.38 | 1.60 | 17.5 |

SEMICONDUCTOR DEVICE, SEMICONDUCTOR MODULE, AND PACKAGED SEMICONDUCTOR DEVICE

CROSS REFERENCE TO RELATED APPLICATION

This application is a divisional of U.S. application Ser. No. 16/261,232 filed Jan. 29, 2019, which is a U.S. continuation application of PCT International Patent Application Number PCT/JP2017/027829 filed on Aug. 1, 2017, claiming the benefit of priority of U.S. Provisional Patent Application No. 62/369,921 filed on Aug. 2, 2016, the entire content of each of which is hereby incorporated by reference.

BACKGROUND

1. Technical Field

The present disclosure relates to a semiconductor device and a semiconductor module, and particularly relates to a multi-transistor chip and a module in which the multi-transistor chip is mounted.

2. Description of the Related Art

In a semiconductor device with a transistor formed on a silicon substrate, reduction of on resistance, and suppression of warpage that occurs to a chip due to heat are required. A low on resistance and small chip warpage can contribute to improvement of both circuit operation efficiency and mounting yield.

For example, Japanese Unexamined Patent Application Publication No. 2010-92895 discloses a semiconductor device in which a front side electrode and a backside electrode are formed from metals having same linear expansion coefficients while the thicknesses of the electrodes are the same or substantially the same as each other in order to suppress warpage due to heat at a time of use of the semiconductor device. Japanese Unexamined Patent Application Publication No. 2011-151350 indicates that the thicknesses of the front side electrode and the backside electrode are set at 10 µm to 20 µm, as an example. Note that in Japanese Unexamined Patent Application Publication No. 2010-92895, reduction of on resistance is not discussed.

Further, Japanese Unexamined Patent Application Publication No. 2011-151350 discloses a semiconductor device capable of improving a warping amount of the backside electrode which is formed on a back surface side of a silicon substrate and an on resistance value, and a method for producing the semiconductor device. According to Japanese Unexamined Patent Application Publication No. 2011-151350, the semiconductor device in which a thickness of the backside electrode is approximately 2 µm and an on resistance is approximately 3 mΩ is obtained.

SUMMARY

The inventors are studying a semiconductor device (hereinafter, referred to as a multi-transistor chip) in which two vertical metal-oxide semiconductor (MOS) transistors are formed on a single silicon substrate, and drains of both the transistors are connected with a backside electrode in the device.

However, the semiconductor devices that are discussed in the related art literatures are both single vertical MOS transistors, and neither reduction of on resistance nor suppression of chip warpage in a multi-transistor chip are considered.

Therefore, an object of the present disclosure is to provide a multi-transistor chip excellent in reduction of on resistance and suppression of chip warpage.

In order to solve the aforementioned problem, a semiconductor device according to an aspect of the present disclosure includes: a semiconductor substrate that includes silicon and a first conductivity-type impurity; a low-concentration impurity layer that is on and in contact with the semiconductor substrate, and includes a first conductivity-type impurity having a concentration lower than a concentration of the first conductivity-type impurity in the semiconductor substrate; a backside electrode that is on and in contact with a back surface of the semiconductor substrate, and includes a metal material; a first vertical metal-oxide semiconductor (MOS) transistor that is located in a first region in the low-concentration impurity layer; and a second vertical MOS transistor that is located in a second region adjacent to the first region in the low-concentration impurity layer, wherein the first vertical MOS transistor includes a first source electrode and a first gate electrode on a surface of the low-concentration impurity layer, the second vertical MOS transistor includes a second source electrode and a second gate electrode on the surface of the low-concentration impurity layer, the semiconductor substrate serves as a common drain region of a first drain region of the first vertical MOS transistor and a second drain region of the second vertical MOS transistor, a thickness of the backside electrode ranges from 25 µm to 35 µm, inclusive, and a ratio of the thickness of the backside electrode to a thickness of a semiconductor layer including the semiconductor substrate and the low-concentration impurity layer is 0.32 or more.

According to this configuration, in any of the multi-transistor chips of models A, B and C according to the embodiment, on resistance R is equal to or less than an on resistance specification maximum value of the model.

According to the semiconductor device according to the present disclosure, the multi-transistor chip excellent in reduction of on resistance and suppression of chip warpage is obtained.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

FIG. 3 is a diagram illustrating product specifications and design examples of the multi-transistor chip according to the embodiment;

FIG. 4A is a diagram illustrating measured values of on resistances and chip warpage of samples of model A;

FIG. 4B is a diagram illustrating measured values of on resistances and chip warpage of samples of model B;

FIG. 4C is a diagram illustrating measured values of on resistances and chip warpage of samples of model C;

Figure 1:
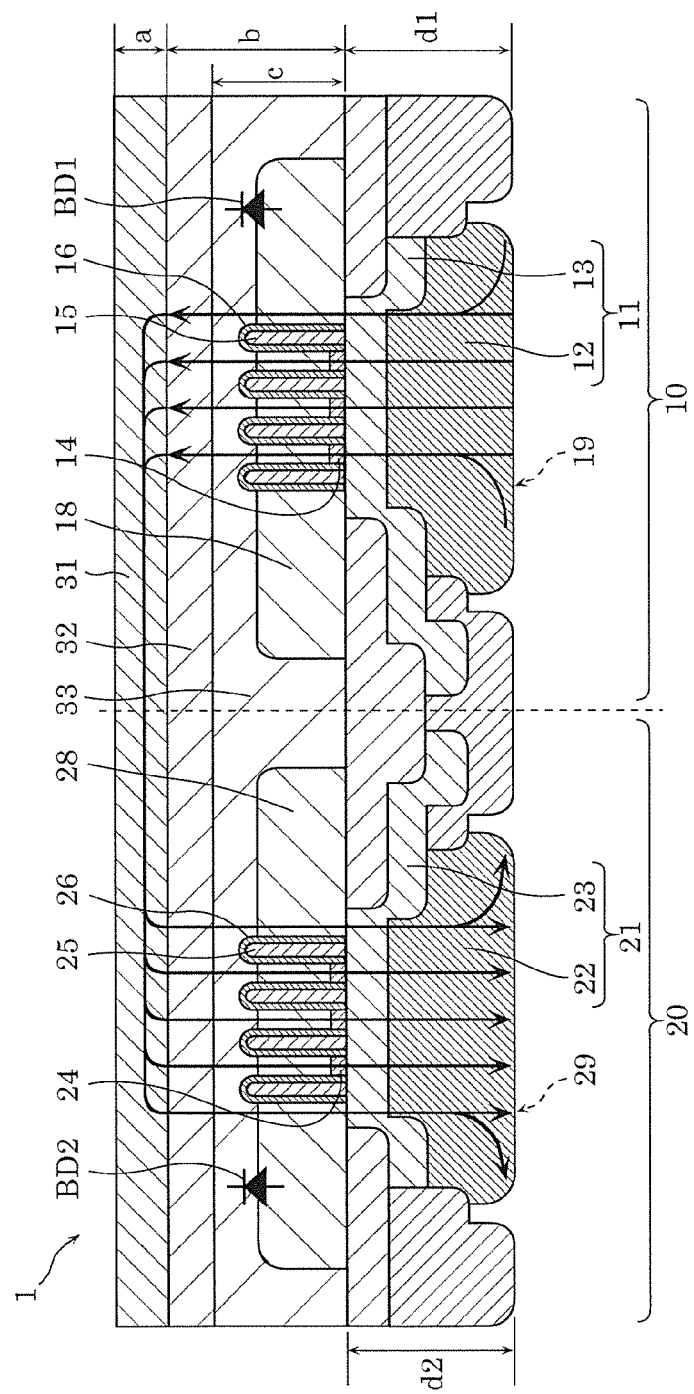
FIG. 1 is a cross-sectional view illustrating an example of a stacking structure of a multi-transistor chip according to an embodiment.

DETAILED DESCRIPTION OF THE EMBODIMENT (Underlying Knowledge Forming the Basis of the Disclosure)

Reduction of on resistance and suppression of chip warpage in a multi-transistor chip will be discussed.

In each of single vertical MOS transistors discussed in the related art literatures, a drain current flows through a backside electrode in a thickness direction, and therefore in order to reduce the on resistance, it is necessary to make the backside electrode thin. In contrast with this, in the multi-transistor chip, a drain current flows in the backside electrodes between the transistors, so that by making the backside electrodes thick, a sectional area of a current path between the two transistors is increased, and the entire on resistance can be reduced. That is, in order to obtain a multi-transistor chip with a low on resistance, it is effective to increase the thickness of the backside electrode more than the thickness of the conventional backside electrode.

Note that a backside electrode is generally composed of a metal material such as silver, and the metal material has a larger thermal expansion coefficient as compared with silicon. Consequently, when the backside electrode is made thick, the semiconductor device easily warps. Accordingly, when the backside electrode is made thick to obtain a low on resistance, suppression of warpage also needs to be sufficiently considered.

It goes against reduction of on resistance to increase the thickness of the backside electrode in a single vertical MOS transistor, so that in the related art literatures, a suitable structure to suppress warpage is not discussed concerning a semiconductor device having a thick backside electrode with a thickness of more than 20 μm. Further, specific examples of the on resistance disclosed in the related art literatures are approximately 3 mΩ.

Therefore, as a result of an intensive study, the inventors have found a first dimensional requirement and an electrode shape that reduce an on resistance to a predetermined target value or less, and a second dimensional requirement that suppresses chip warpage to a predetermined target value or less, with respect to a multi-transistor chip having a backside electrode with a thickness of approximately 30 μm that is thicker than the conventional backside electrodes. The target value of the on resistance is set at an extremely low value of less than 3 mΩ, and the first and second dimensional requirements include prescriptions regarding a ratio of a thickness of the backside electrode to a thickness of a semiconductor substrate.

(Aspects of Disclosed Semiconductor Device)

A semiconductor device according to an aspect of the present disclosure includes: a semiconductor substrate that includes silicon and a first conductivity-type impurity; a low-concentration impurity layer that is on and in contact with the semiconductor substrate, and includes a first conductivity-type impurity having a concentration lower than a concentration of the first conductivity-type impurity in the semiconductor substrate; a backside electrode that is on and in contact with a back surface of the semiconductor substrate, and includes a metal material; a first vertical metal-oxide semiconductor (MOS) transistor that is located in a first region in the low-concentration impurity layer; and a second vertical MOS transistor that is located in a second region adjacent to the first region in the low-concentration impurity layer, wherein the first vertical MOS transistor includes a first source electrode and a first gate electrode on a surface of the low-concentration impurity layer, the second vertical MOS transistor includes a second source electrode and a second gate electrode on the surface of the low-concentration impurity layer, the semiconductor substrate serves as a common drain region of a first drain region of the first vertical MOS transistor and a second drain region of the second vertical MOS transistor, a thickness of the backside electrode ranges from 25 μm to 35 μm, inclusive, and a ratio of the thickness of the backside electrode to a thickness of a semiconductor layer including the semiconductor substrate and the low-concentration impurity layer is 0.32 or more.

According to the configuration, in any of the multi-transistor chips of models A, B and C according to the embodiment, on resistance R is equal to or less than an on resistance specification maximum value of the model.

Furthermore, the ratio may be 0.56 or less.

According to the configuration, in any one of the multi-transistor chips of models A, B and C according to the embodiment, on resistance R is equal to or less than an on resistance specification maximum value of the model, and chip warpage is equal to or less than a chip warpage specification maximum value.

Furthermore, the thickness of the low-concentration impurity layer may be 2.75 μm or more.

According to the configuration, in the multi-transistor chips of models A, B and C according to the embodiment, a drain breakdown voltage of 20 Vis obtained.

Furthermore, a semiconductor device according to an aspect of the present disclosure includes: a semiconductor substrate that includes silicon and a first conductivity-type impurity; a low-concentration impurity layer that is on and in contact with the semiconductor substrate, and includes a first conductivity-type impurity having a concentration lower than a concentration of the first conductivity-type impurity in the semiconductor substrate; a backside electrode that is on and in contact with a back surface of the semiconductor substrate, and includes a metal material; a first vertical MOS transistor that is located in a first region in the low-concentration impurity layer; and a second vertical MOS transistor that is located in a second region adjacent to the first region in the low-concentration impurity layer. The first vertical MOS transistor includes a first source electrode and a first gate electrode on a surface of the low-concentration impurity layer, the second vertical MOS transistor includes a second source electrode and a second gate electrode on the surface of the low-concentration impurity layer, the semiconductor substrate serves as a common drain region of a first drain region of the first vertical MOS transistor and a second drain region of the second vertical MOS transistor, a thickness of the backside electrode ranges from 25 µm to 35 µm, inclusive, and when a diagonal dimension of the semiconductor substrate in a plan view is set as L mm, a ratio of a thickness of the backside electrode to a thickness of a semiconductor layer including the semiconductor substrate and the low-concentration impurity layer is (−0.48×L+2.45) or less.

According to the configuration, in the multi-transistor chip having diagonal length L according to the embodiment, chip warpage is equal to or less than the chip warpage specification maximum value.

A semiconductor device according to an aspect of the present disclosure includes: a semiconductor substrate that includes silicon and a first conductivity-type impurity; a low-concentration impurity layer that is on and in contact with the semiconductor substrate, and includes a first conductivity-type impurity having a concentration lower than a concentration of the first conductivity-type impurity in the semiconductor substrate; a backside electrode that is on and in contact with a back surface of the semiconductor substrate, and includes a metal material; a first vertical MOS transistor that is located in a first region in the low-concentration impurity layer; and a second vertical MOS transistor that is located in a second region adjacent to the first region in the low-concentration impurity layer. The first vertical MOS transistor includes a first source electrode and a first gate electrode on a surface of the low-concentration impurity layer, the second vertical MOS transistor includes a second source electrode and a second gate electrode on the surface of the low-concentration impurity layer, the semiconductor substrate serves as a common drain region of a first drain region of the first vertical MOS transistor and a second drain region of the second vertical MOS transistor, a thickness of the backside electrode ranges from 25 µm to 35 µm, inclusive, and when a diagonal dimension of the semiconductor substrate in a plan view is set as L mm, a ratio of a thickness of the backside electrode to a thickness of a semiconductor layer including the semiconductor substrate and the low-concentration impurity layer is (−0.48×L+2.07) or more.

According to the configuration, in the multi-transistor chip having diagonal length L according to the embodiment, the on resistance R is equal to or less than an on resistance specification standard value.

Furthermore, the ratio may be at least (−0.48×L+2.07) and at most (−0.48×L+2.45).

According to the configuration, in the multi-transistor chip having diagonal length L according to the embodiment, the on resistance is equal to or less than the on resistance specification standard value, and the chip warpage is equal to or less than the chip warpage specification maximum value.

Furthermore, when a thickness of the low-concentration impurity layer is 2.18 µm or less and a diagonal dimension of the semiconductor substrate in a plan view is 2.69 mm or more, the ratio may be 0.78 or more.

According to the configuration, in a multi-transistor chip of model A according to the embodiment, the on resistance specification standard value is achieved.

Furthermore, when the thickness of the low-concentration impurity layer is 2.18 µm or less and the diagonal dimension ranges from 2.61 mm to 2.69 mm, inclusive, or when the thickness of the low-concentration impurity layer ranges from 2.18 µm to 2.24 µm, inclusive, and the diagonal dimension is 2.69 mm or more, the ratio may be 0.94 or more.

According to the configuration, even when a multi-transistor chip of model A according to the embodiment has a predetermined dimensional error, the on resistance R is equal to or less than an on resistance specification standard value of model A.

Furthermore, when a thickness of the low-concentration impurity layer is 2.18 µm or less and a diagonal dimension of the semiconductor substrate in a plan view is 3.63 mm or more, the ratio may be 0.33 or more.

According to the configuration, in a multi-transistor chip of model C according to the embodiment, an on resistance specification standard value is achieved.

Furthermore, when the thickness of the low-concentration impurity layer is 2.18 µm or less and the diagonal dimension ranges from 3.55 mm to 3.63 mm, inclusive, or when the thickness of the low-concentration impurity layer ranges from 2.18 µm to 2.24 µm, inclusive, and the diagonal dimension is 3.63 mm or more, the ratio may be 0.43 or more.

According to the configuration, even when a multi-transistor chip of model C according to the embodiment has a predetermined dimensional error, on resistance R is equal to or less than an on resistance specification standard value of model C.

Furthermore, the ratio may be 0.70 or less.

According to the configuration, in a multi-transistor chip of model C according to the embodiment, a chip warpage specification maximum value is achieved.

Furthermore, when a thickness of the low-concentration impurity layer is 2.75 µm or less, and a diagonal dimension of the semiconductor substrate in a plan view is 3.92 mm or more, the ratio may be 0.25 or more.

According to the configuration, in a multi-transistor chip of model B according to the embodiment, an on resistance specification standard value is achieved.

Furthermore, when the thickness of the low-concentration impurity layer is 2.75 µm or less and the diagonal dimension ranges from 3.84 mm to 3.92 mm, inclusive, or when the thickness of the low-concentration impurity layer ranges from 2.75 µm to 2.81 µm, inclusive, and the diagonal dimension is 3.92 mm or more, the ratio may be 0.33 or more.

According to the configuration, even when a multi-transistor chip of model B according to the embodiment has a predetermined dimensional error, on resistance R is equal to or less than the on resistance specification standard value of model B.

Furthermore, the ratio may be 0.56 or less.

According to the configuration, in a multi-transistor chip of model B according to the embodiment, a chip warpage specification maximum value is achieved.

A semiconductor device according to an aspect of the present disclosure includes: a semiconductor substrate that includes silicon and a first conductivity-type impurity; a low-concentration impurity layer that is on and in contact with the semiconductor substrate, and includes a first conductivity-type impurity having a concentration lower than a concentration of the first conductivity-type impurity in the semiconductor substrate; a backside electrode that is on and in contact with a back surface of the semiconductor substrate, and includes a metal material; a first vertical MOS transistor that is located in a first region in the low-concentration impurity layer; and a second vertical MOS transistor that is located in a second region adjacent to the first region in the low-concentration impurity layer. The first vertical MOS transistor includes a first source electrode and a first gate electrode on a surface of the low-concentration impurity layer, the second vertical MOS transistor includes a second source electrode and a second gate electrode on the surface of the low-concentration impurity layer, the semiconductor substrate serves as a common drain region of a first drain region of the first vertical MOS transistor and a second drain region of the second vertical MOS transistor, a ratio of a thickness of the first source electrode to a thickness of the backside electrode is 0.28 or less, and a ratio of a thickness of the second source electrode to the thickness of the backside electrode is 0.28 or less.

According to the configuration, with respect to the thickness of the backside electrode, favorable thicknesses of the first and second source electrodes are defined, so that the multi-transistor chip is obtained, in which the bonding performance with the conductive bonding material, lower on resistance and cost reduction are achieved in a well-balanced way.

A semiconductor device according to an aspect of the present disclosure includes: a semiconductor substrate that includes silicon and a first conductivity-type impurity; a low-concentration impurity layer that is on and in contact with the semiconductor substrate, and includes a first conductivity-type impurity having a concentration lower than a concentration of the first conductivity-type impurity in the semiconductor substrate; a backside electrode that is on and in contact with a back surface of the semiconductor substrate, and includes a metal material; a first vertical MOS transistor that is located in a first region in the low-concentration impurity layer; and a second vertical MOS transistor that is located in a second region adjacent to the first region in the low-concentration impurity layer. The first vertical MOS transistor includes a plurality of first source electrodes and a first gate electrode on a surface of the low-concentration impurity layer, the second vertical MOS transistor includes a plurality of second source electrodes and a second gate electrode on the surface of the low-concentration impurity layer, the semiconductor substrate serves as a common drain region of a first drain region of the first vertical MOS transistor and a second drain region of the second vertical MOS transistor, and a third source electrode included in the plurality of the first source electrodes and a fourth source electrode included in the plurality of the second source electrodes are source electrodes disposed closest to a boundary between the first region and the second region, the third source electrode and the fourth source electrode extending along an entirety of the boundary.

According to the configuration, a path of a current that flows between the two vertical MOS transistors becomes wider and shorter, so that the on resistance of the multi-transistor chip can be reduced.

Furthermore, an interval between the third source electrode and the fourth source electrode may be narrower than a width of the third source electrode and narrower than a width of the fourth source electrode.

According to the configuration, the path of the current that flows between the two vertical MOS transistors can be made wider and shorter, so that the on resistance of the multi-transistor chip can be reduced more effectively.

Furthermore, an interval between the third source electrode and the fourth source electrode may be wider than a width of the third source electrode and wider than a width of the fourth source electrode.

According to the configuration, the region where solder is not disposed can be taken widely, so that short circuits between patterns can be avoided while the path of the current that flows between the two vertical MOS transistors is made wider and shorter.

A semiconductor device according to an aspect of the present disclosure includes: a semiconductor substrate that includes silicon and a first conductivity-type impurity; a low-concentration impurity layer that is on and in contact with the semiconductor substrate, and includes a first conductivity-type impurity having a concentration lower than a concentration of the first conductivity-type impurity in the semiconductor substrate; a backside electrode that is on and in contact with a back surface of the semiconductor substrate, and includes a metal material; a first vertical MOS transistor that is located in a first region in the low-concentration impurity layer; and a second vertical MOS transistor that is located in a second region adjacent to the first region in the low-concentration impurity layer. The first vertical MOS transistor includes a first source electrode and a first gate electrode on a surface of the low-concentration impurity layer, the second vertical MOS transistor includes a second source electrode and a second gate electrode on the surface of the low-concentration impurity layer, the semiconductor substrate serves as a common drain region of a first drain region of the first vertical MOS transistor and a second drain region of the second vertical MOS transistor, the first source electrode comprises, between (i) a boundary of the first region and the second region and (ii) a first opposite end which is an end of the first region that is opposite to the boundary, a plurality of first source electrodes aligned in a direction that crosses the boundary, the first gate electrode is disposed at a position that is near a center of the first opposite end in a direction parallel to the boundary and between a pair of the plurality of first source electrodes in the direction parallel to the boundary, a center point of the first gate electrode is disposed at a position that is offset toward the first opposite end from a boundary-side end of a first source electrode farthest from the boundary, in the first region, the boundary-side end being an end of the first source electrode that is closest to the boundary, the second source electrode comprises, between the boundary and a second opposite end which is an end of the second region that is opposite to the boundary, a plurality of second source electrodes aligned in a direction that crosses the boundary, the second gate electrode is disposed at a position that is near a center of the second opposite end in a direction parallel to the boundary and between a pair of the plurality of second source electrodes in the direction parallel to the boundary, and a center point of the second gate electrode is disposed at a position that is offset toward the second opposite end from a boundary-side end of a second source electrode farthest from the boundary, in the second region, the boundary-side end being an end of the second source electrode that is closest to the boundary.

According to the configuration, the first gate electrode and the second gate electrode are disposed farther from the boundary, so that even when chip warpage occurs to the semiconductor substrate and the vicinity of the boundary is lifted from the mounting board, solder open hardly occurs between the first gate electrode and the second gate electrode and the mounting board.

Furthermore, a semiconductor module according to an aspect of the present disclosure includes: a printed wiring board; a wiring pattern that is provided in a strip shape on the printed wiring board, and is separated into a first section and a second section by a gap that crosses a longitudinal direction of the wiring pattern; and the above-described semiconductor device that is disposed on the gap. The semiconductor device is disposed in an orientation in which the first region and the second region align in a longitudinal direction of the wiring pattern, and the first source electrode and the second source electrode are respectively connected to the first section and the second section of the wiring pattern.

According to the configuration, a wiring width can be increased and a wiring resistance can be reduced. Further, the current path becomes rectilinear, and a wiring loss can be reduced. As a result, the semiconductor module having the mounting structure excellent in power efficiency is obtained.

Furthermore, a packaged semiconductor device according to an aspect of the present disclosure includes: the above described semiconductor device; and a package in which the semiconductor device is sealed, the package having a first source external terminal, a first gate external terminal, a second source external terminal, and a second gate external terminal. The first source external terminal, the first gate external terminal, the second source external terminal, and the second gate external terminal are electrically connected respectively to the first source electrode, the first gate electrode, the second source electrode, and the second gate electrode of the semiconductor device.

According to the configuration, the packaged semiconductor device is obtained, which has the multi-transistor chip excellent in reduction of the on resistance and suppression of chip warpage, and having high durability against environmental conditions.

Furthermore, a packaged semiconductor device according to an aspect of the present disclosure includes: the above-described semiconductor device; and a package in which the semiconductor device is sealed, the package having a first source external terminal, a first gate external terminal, a second source external terminal, a second gate external terminal, and a common drain external terminal. The first source external terminal, the first gate external terminal, the second source external terminal, the second gate external terminal, and the common drain external terminal are electrically connected respectively to the first source electrode, the first gate electrode, the second source electrode, the second gate electrode, and the backside electrode of the semiconductor device.

According to the configuration, the packaged semiconductor device is obtained, which has the multi-transistor chip excellent in reduction of the on resistance and suppression of chip warpage, has high durability against the environmental conditions, and can use the common drain external terminal in voltage monitor for the common drain of the first and second vertical MOS transistors in the multi-transistor chip, for example.

Hereinafter, the semiconductor device according to the disclosure will be described specifically with reference to the drawings.

Embodiments that will be described hereinafter each shows a specific example of the present disclosure. The numerical values, shapes, materials, components, disposing positions and connecting modes of the components and the like shown in the following embodiments are only examples, and do not intend to restrict the present disclosure. Further, out of the components in the following embodiments, components that are not described in independent claims showing the most superordinate concepts are described as arbitrary components.

(Basic Structure of Semiconductor Device)

First, as preparation, a basic structure of the semiconductor device according to the present disclosure will be described. The semiconductor device according to the present disclosure is a CSP (chip size package) type multi-transistor chip in which two vertical MOS transistors are formed on a semiconductor substrate.

FIG. 1 is a cross-sectional view illustrating an example of a structure of multi-transistor chip 1. As illustrated in FIG. 1, multi-transistor chip 1 includes semiconductor substrate 32, low-concentration impurity layer 33, backside electrode 31, first vertical MOS transistor 10 (hereinafter, transistor 10), and second vertical MOS transistor 20 (hereinafter, transistor 20).

Figure 2:
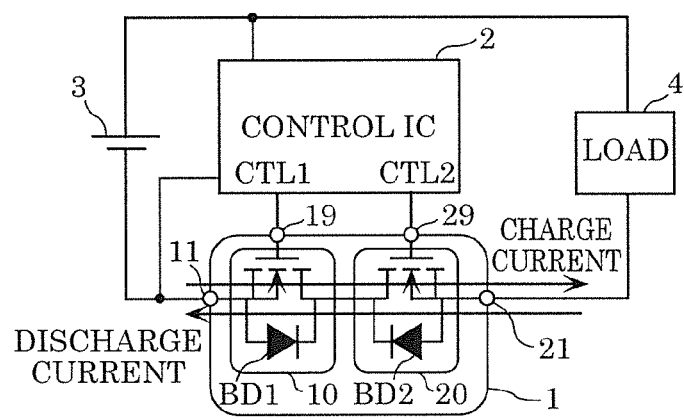
FIG. 2 is a circuit diagram illustrating an example of an application circuit of the multi-transistor chip according to the embodiment.

FIG. 2 is a charge and discharge circuit of a smartphone or the like, and illustrates a case in which multi-transistor chip 1 is inserted into a low side of the charge and discharge circuit, and is used as a charge and discharge switch that controls conduction of two-way currents, as an application example.

In this case, multi-transistor chip 1 is used as a two-way transistor that controls a discharge current from battery 3 to load 4 and a charge current from load 4 to battery 3, in response to a control signal that is given by control IC 2, and the discharge current is cut off by bringing transistor 10 into an off state, whereas the charge current is cut off by bringing transistor 20 into an off state.

In a MOS transistor, a body diode is present as a parasite element between a drain terminal and a source terminal due to a device configuration of the MOS transistor (for example, BD1 in transistor 10 and BD2 in transistor 20 in FIG. 2), so that with a single MOS transistor, two-way currents between drain and source terminals cannot be cut off. Therefore, when two-way currents are cut off, two MOS transistors are generally used by being connected with drain terminals or source terminals facing each other.

In multi-transistor chip 1 illustrated in FIG. 1, semiconductor substrate 32 includes silicon and a first conductivity-type impurity.

Low-concentration impurity layer 33 is formed on semiconductor substrate 32 in contact with semiconductor substrate 32, and includes a first conductivity-type impurity having a concentration lower than a concentration of the first conductivity-type impurity in semiconductor substrate 32. Low-concentration impurity layer 33 may be formed on semiconductor substrate 32 by epitaxial growth as an example.

A thickness of a semiconductor layer including semiconductor substrate 32 and low-concentration impurity layer 33 (also referred to as Si thickness) is described as b, and a thickness of only low-concentration impurity layer 33 (also referred to as an epi thickness) is described as c.

Backside electrode 31 is composed of a metal material formed on a back surface (upper side principal surface in FIG. 1) of semiconductor substrate 32 in contact with the back surface. Backside electrode 31 may be composed of a metal material including at least any one of silver, copper, gold and aluminum, as a non-limiting example. A thickness of backside electrode 31 (also referred to as an Ag thickness) is described as a.

Transistor 10 is formed in a first region (right side half region in FIG. 1) in low-concentration impurity layer 33, and includes first source electrode 11 and first gate electrode 19 that is in another section, on a surface (lower side principal surface in FIG. 1) of low-concentration impurity layer 33.

In a first region of low-concentration impurity layer 33, first body region 18 including a second conductivity-type impurity having a second conductivity type different from the first conductivity-type is formed. In first body region 18, first source region 14 including a first conductivity-type impurity, first gate conductor 15 and first gate insulation film 16 are formed. First source electrode 11 includes first portion 12 and second portion 13, and first portion 12 is connected to first source region 14 and first body region 18 via second portion 13. First gate electrode 19 is connected to first gate conductor 15.

First portion 12 of first source electrode 11 is a layer showing a favorable bonding performance with a conductive bonding material such as solder at a time of mounting, and may be composed of a metal material including at least any one or more of nickel, titanium, tungsten and palladium as a non-limiting example. Plating of gold or the like may be applied to a surface of first portion 12.

Second portion 13 of first source electrode 11 is a layer that connects first portion 12 and a semiconductor layer, and may be composed of a metal material including at least any one or more of aluminum, copper, gold and silver as a non-limiting example.

A thickness of first source electrode 11 is described as d1. Thickness d1 of first source electrode 11 includes a thickness of first portion 12 and a thickness of second portion 13 of first source electrode 11.

Transistor 20 is formed in a second region (left side half region in FIG. 1) in low-concentration impurity layer 33, and includes second source electrode 21 and second gate electrode 29 that is in another section, on the front surface (lower principal surface in FIG. 1) of low-concentration impurity layer 33.

In the second region of low-concentration impurity layer 33, second body region 28 including a second conductivity-type impurity having a second conductivity type different from a first conductivity-type is formed. In second body region 28, second source region 24 including a first conductivity-type impurity, second gate conductor 25 and second gate insulation film 26 are formed. Second source electrode 21 includes first portion 22 and second portion 23, and first portion 22 is connected to second source region 24 and second body region 28 via second portion 23. Second gate electrode 29 is connected to second gate conductor 25.

First portion 22 of second source electrode 21 may be composed of a metal material including any one or more of nickel, titanium, tungsten and palladium as a non-limiting example, and plating of gold or the like may be applied to a surface of first portion 22. Second portion 23 of second source electrode 21 may be composed of a metal material including any one or more of aluminum, copper, gold and silver as a non-limiting example.

A thickness of second source electrode 21 is described as d2. Thickness d2 of second source electrode 21 includes a thickness of first portion 22 and a thickness of second portion 23 of second source electrode 21. Thickness d1 of first source electrode 11 and thickness d2 of second source electrode 21 may be equal to each other.

Semiconductor substrate 32 serves as a common drain region of a first drain region of transistor 10 and a second drain region of transistor 20.

In multi-transistor chip 1 illustrated in FIG. 1, for example, by setting the first conductivity-type as an N-type and the second conductivity-type as a P-type, first source region 14, second source region 24, semiconductor substrate 32 and low-concentration impurity layer 33 may be N-type semiconductors, and first body region 18 and second body region 28 may be P-type semiconductors.

Further, for example, by setting the first conductivity-type as a P-type, and the second conductivity-type as an N-type, first source region 14, second source region 24, semiconductor substrate 32 and low-concentration impurity layer 33 may be P-type semiconductors, and first body region 18 and second body region 28 may be N-type semiconductors.

In the following explanation, a case of a so-called N-channel type transistor in which the first conductivity-type is set as an N-type and the second conductivity-type is set as a P-type in multi-transistor chip 1 illustrated in FIG. 1 will be described, unless otherwise noted.

First, an on state of multi-transistor chip 1 will be described.

When a high voltage is applied to first source electrode 11, a low voltage is applied to second source electrode 21, and a voltage of a threshold value or more is applied to first gate electrode 19 (first gate conductor 15) and second gate electrode 29 (second gate conductor 25) with second source electrode 21 as a reference in multi-transistor chip 1 illustrated in FIG. 1, a channel is formed in vicinities of first gate insulation film 16 and second gate insulation film 26, and a current flows between first source electrode 11 and second source electrode 21 in a path shown by arrows in FIG. 1.

This is a case of a charging current in FIG. 2, and is the on state of multi-transistor chip 1 in which transistors 10 and 20 are in electrical continuity and an on current flows.

The on current between transistors 10 and 20 flows in backside electrode 31, as illustrated in arrows in FIG. 1. Consequently, by increasing thickness a of backside electrode 31, a sectional area of the path for the on current enlarges, and an on resistance of multi-transistor chip 1 is reduced.

Next, an off state of multi-transistor chip 1 will be described.

When the first conductivity-type is an N-type, and the second conductivity-type is a P-type in multi-transistor chip 1 illustrated in FIG. 1, PN junctions between first body region 18 and low-concentration impurity layer 33, and between second body region 28 and low-concentration impurity layer 33 are respectively body diodes BD1 and BD2 in polarity directions shown by diode symbols in FIG. 1.

When a voltage of second gate electrode 29 (second gate conductor 25) is less than a threshold value with second source electrode 21 as a reference in multi-transistor chip 1 illustrated in FIG. 1, a channel is not formed in a vicinity of gate insulation film 26 of transistor 20 even if a high voltage is applied to first source electrode 11, and a low voltage is applied to second source electrode 21, and multi-transistor chip 1 is in an off state in which the on current does not flow. At this time, a bias state in transistor 10 is a bias state in a forward direction with respect to body diode BD1, so that transistor 10 is in a conducting state independently from the voltage which is applied to first gate electrode 19 (first gate conductor 15).

When voltage application conditions to first source electrode 11 and second source electrode 21 are opposite, that is, a high voltage is applied to second source electrode 21, and a low voltage is applied to first source electrode 11, a channel is not formed in a vicinity of gate insulation film 16 of transistor 10 if a voltage of first gate electrode 19 (first gate conductor 15) is less than a threshold value with first source electrode 11 as a reference, and multi-transistor chip 1 is in an off state in which the on current does not flow.

(Source to Source Breakdown Voltage of Multi-Transistor Chip)

Here, a source to source breakdown voltage (abbreviated as BVSS) of multi-transistor chip 1 will be described.

The source to source breakdown voltage of multi-transistor chip 1 refers to a maximum voltage that can be applied to between first source electrode 11 and second source electrode 21 of multi-transistor chip 1 in an off state within a range in which multi-transistor chip 1 does not break down. This is a maximum voltage that can be applied within a range in which body diodes BD1 and BD2 do not break down, and has the same meaning as a drain breakdown voltage in each of transistors 10 and 20 alone. In the following explanation, for simplification, the source to source breakdown voltage of multi-transistor chip 1 may be called a drain breakdown voltage of multi-transistor chip 1.

The drain breakdown voltage of multi-transistor chip 1 will be described in more detail. The drain breakdown voltage at a time of applying a high voltage to first source electrode 11 of multi-transistor chip 1 and a low voltage to second source electrode 21 relates to depletion layers that are present at both sides of a boundary of a PN junction of body diode BD2 contained in transistor 20.

When a high voltage is applied to first source electrode 11, and a low voltage is applied to second source electrode 21, a reverse-direction voltage is applied to a PN junction of low-concentration impurity layer 33 (N-type semiconductor) and second body region 28 (P-type semiconductor) in transistor 20.

In this case, the reverse-direction voltage is applied, so that a current from low-concentration impurity layer 33 to second body region 28 does not flow, but when the applied voltage is gradually increased, avalanche breakdown (simply referred to as breakdown in the present specification) occurs in the PN junction, and a current flows at once. The applied voltage just before the avalanche breakdown occurs is a drain breakdown voltage.

In order to increase the drain breakdown voltage, thicknesses of the depletion layers formed at both sides of the boundary of low-concentration impurity layer 33 and second body region 28 are increased to make it difficult for avalanche breakdown to occur. For this reason, a device structure in which the depletion layers can spread out sufficiently is designed.

The depletion layers spread out at both sides with the boundary of low-concentration impurity layer 33 and second body region 28 between the depletion layers, but since the impurity concentration of low-concentration impurity layer 33 is set to be lower than the impurity concentration of second body region 28, the depletion layer spreads out greatly to a side of low-concentration impurity layer 33. Accordingly, a thickness of the low-concentration impurity layer 33 is designed with a margin in consideration of spreading of the depletion layer.

Further, it is known that N-type impurities diffuse from semiconductor substrate 32 to low-concentration impurity layer 33, due to a thermal hysteresis that occurs during a device fabrication process. This means that an effective film thickness of low-concentration impurity layer 33 decreases. In order to secure a sufficient spread of the depletion layers, it is necessary to design the layer thickness of low-concentration impurity layer 33 also considering a decrease of the effective thickness.

Same explanation is established with respect to low-concentration impurity layer 33 and first body region 18 of transistor 10 when a low voltage is applied to first source electrode 11 and a high voltage is applied to second source electrode 21.

In consideration of the above, in multi-transistor chip 1, a drain breakdown voltage of 12 V or 20 V is secured with a design margin by adopting the following design examples.

A concentration of impurities (for example, arsenide or phosphorous) in semiconductor substrate 32 is set as $3 \times 10^{20}/\text{cm}^3$, and a concentration of impurities (for example, phosphor) in low-concentration impurity layer 33 is set as $3.4 \times 10^{16}/\text{cm}^3$. Further, a concentration of impurities (for example, boron) in first body region 18 and second body region 28 is set as $5 \times 10^{17}/\text{cm}^3$.

When the drain breakdown voltage is set as 12 V, thickness c of low-concentration impurity layer 33 is set as 2.18 µm or more. When the drain breakdown voltage is set as 20 V, thickness c of low-concentration impurity layer 33 is set as 2.75 µm or more.

(Product Specifications and Design Example of Multi-Transistor Chip)

FIG. 3 is a diagram illustrating specifications and a design example of each of models of the multi-transistor chip according to the embodiment.

First, as illustrated in FIG. 3, the inventors set product specifications concerning drain breakdown voltage BVSS, on resistance R and chip warpage W with respect to three models of the multi-transistor chip according to the embodiment. Here, drain breakdown voltage BVSS refers to the source to source breakdown voltage of multi-transistor chip 1 described above. On resistance R refers to a resistance value between the source and source of multi-transistor chip 1 at a time of application of a gate to source voltage of 3.8 V. Chip warpage W refers to a maximum difference in elevation that occurs along the diagonal line of a bare chip of multi-transistor chip 1 by application of thermal load of a maximum temperature of 250° C.

Model A is a normal model in which drain breakdown voltage BVSS is 12 V, on resistance specification maximum value R max is 2.85 mΩ, and chip warpage specification maximum value W max is 40 µm. 2.19 mΩ to 2.38 mΩ of on resistance specification standard value R typ are calculation values that are obtained by dividing on resistance specification maximum value R max by design margin coefficients 1.3 to 1.2.

Model B is a high breakdown voltage model in which drain breakdown voltage BVSS is 20 V, on resistance specification maximum value R max is 2.85 mΩ, and chip warpage specification maximum value W max is 40 µm. 2.19 mΩ to 2.38 mΩ of on resistance specification standard value R typ are calculation values obtained by dividing on resistance specification maximum value R max by design margin coefficients 1.3 to 1.2.

Model C is a low resistance model with drain breakdown voltage BVSS is 12 V, on resistance specification maximum value R max is 1.95 mΩ, and chip warpage specification maximum value W max is 40 µm. 1.50 mΩ to 1.63 mΩ of on resistance specification standard value R typ are calculation values obtained by dividing on resistance specification maximum value R max by design margin coefficients 1.3 to 1.2.

Drain breakdown voltage BVSS and on resistance specification maximum value R max illustrated in FIG. 3 are defined based on a request by an application circuit (for example, a charge and discharge circuit of a battery provided in a mobile computing device).

Further, chip warpage specification maximum value W max is defined as follows based on "Measurement methods of package warpage at elevated temperature and the maximum permissible warpage" described in JEITA ED-7306 Standard of Japan Electronics and Information Technology Industries Association.

In multi-transistor chip 1, a thermal expansion coefficient of backside electrode 31 is larger than a thermal expansion coefficient of semiconductor substrate 32, so that by rising a temperature, chip warpage raised to a side of backside electrode 31 occurs. When chip warpage is large, a central portion of multi-transistor chip 1 is lifted from the mounting substrate by reflow heating at the time of mounting, and mounting yield is worsened.

In "Measurement methods of package warpage at elevated temperature and the maximum permissible warpage" described in JEITA ED-7306 Standard of Japan Electronics and Information Technology Industries Association, the maximum permissible warpage of, for example, FLGA (flat land grid array) package is defined as a height of solder paste after melting. When solder paste of a height of 80 μm is disposed by printing using a stencil of a thickness of 80 μm as an example, in a mounting process, the height of the solder paste after melting is estimated to lower to 59 μm corresponding to 74% that is a filling factor of a face-centered cubic lattice. Therefore, in the present disclosure, 40 μm with the design margin coefficient further reduced to approximately ⅔ is set as the chip warpage specification maximum value.

Next, the inventors considered dimensional requirements and electrode shape of the multi-transistor chip of each model with the following policy based on the product specifications in FIG. 3.

Drain breakdown voltage BVSS is achieved in accordance with epi thickness c that is the thickness of low-concentration impurity layer 33. For example, by setting epi thickness c at 2.18 μm or more, the drain breakdown voltage of 12 V is achieved. Further, the drain breakdown voltage of 20 V is achieved by setting epi thickness c at 2.75 μm or more.

On resistance R is reduced by providing backside electrode 31 thickly. As an example, by setting an Ag thickness that is the thickness of backside electrode 31 at 30 μm, and increasing a sectional area of a current path in the backside electrode, on resistance R is reduced. Si thickness b that is the thickness of the semiconductor layer including semiconductor substrate 32 and low-concentration impurity layer 33 of the semiconductor layer is set at 43 μm in models A and C, and is set at 78 μm in model B, as an example. At this time, ratio Q of Ag thickness a to Si thickness b is 0.70 in models A and C, and is 0.38 in model B. Ratios Q of these models are typical examples that achieve the product specifications concerning on resistance R and chip warpage W in respective models A, B and C.

A package size is set to be equivalent to or less than the conventional model (not illustrated). Area resistance rate Ron·A is reduced, so that on resistance R which is equivalent to on resistance R of the conventional model can be realized with a smaller package size, and lower on resistance R can be realized with a package size equivalent to the package size of the conventional model.

Specifically, a package size of model A was made a rectangle of 1.96 mm in length and 1.84 mm in width in a plan view. A length of a diagonal line of a package of model A, that is, diagonal line L is 2.69 mm. In model A, a side shown in a vertical direction in FIG. 3 is a long side.

A package size of model B was made a rectangle of 1.96 mm in length and 3.40 mm in width in a plan view. A length of a diagonal line of a package of model B, that is, diagonal length L is 3.92 mm. In model B, a side shown in a lateral direction in FIG. 3 is a long side.

A package size of model C was made a rectangle of 1.96 mm in length and 3.05 mm in width in a plan view. A length of a diagonal line of a package of model C, that is, diagonal length L is 3.63 mm. In model C, a side shown in the lateral direction in FIG. 3 is a long side.

Since multi-transistor chip 1 is a chip size package, a package size, a size of multi-transistor chip 1 and a size of semiconductor substrate 32 are all same. That is, the diagonal length of the package is expressed by a diagonal dimension of semiconductor substrate 32 in a plan view.

FIG. 3 illustrates disposition of a source pad (described as an S pad) and a gate pad (described as a G pad) at a time of the package been seen in a plan view as a chip general view. Here, the S pads refer to exposed portions to a chip surface, of first source electrode 11 and second source electrode 21, and G pads refer to exposed portions to the chip surface, of first gate electrode 19 and second gate electrode 29.

In model A, the G pads are disposed to a center with respect to a chip long side, and the S pads are disposed by being separated to two portions along a boundary of two transistors. In each of model B and model C, the G pads are disposed to ends with respect to chip long sides, and the S pads are disposed to be close to the boundary of two transistors in an entire area. In the mounting process of package, the S pads and the G pads are attached to the mounting substrate by using a conductive bonding material such as solder.

Note that technical meaning of disposition of the S pads and G pads illustrated in FIG. 3 will be described in detail later.

Next, considering that reduction of on resistance R and suppression of chip warpage W are in a trade-off relationship, a favorable range of ratio Q of thickness a of backside electrode 31 (Ag thickness) to thickness b of the semiconductor layer (Si thickness) including semiconductor substrate 32 and low-concentration impurity layer 33 will be discussed in detail.

(Experiment for Obtaining Favorable Conditions of Ratio Q)

The inventors obtained the favorable range of ratio Q by an experiment. In the experiment, a plurality of samples each having epi thickness c and the package size (diagonal length L) illustrated in FIG. 3, but differing in Ag thickness a and Si thickness b were produced. Subsequently, on resistances and chip warpage of the individual samples were measured, and whether or not the on resistances and chip warpage satisfy the product specifications was confirmed.

As for on resistance R, each sample was measured by either one of a first method of measuring on resistance R in a state where the sample is mounted on an evaluation substrate, and a second method of measuring in a state of a bare chip by applying a probe. A difference in measurement value that occurs due to difference in measurement method was properly corrected.

As for chip warpage W, the sample in the state of a bare chip was placed under a thermal load cycle with a maximum temperature of 250° C. simulating a reflow process, a shape of the bare chip was measured by a moire method, and a maximum value of measured chip warpage was recorded.

FIG. 4A is a diagram illustrating measured values of the on resistance and warpage of samples of model A. In model A, a plurality of samples with Si thicknesses b being between 28 μm to 93 μm were produced, with respect to the respective samples with Ag thicknesses a of 25 μm, 30 μm and 35 μm. All of the samples of model A have epi thickness c of 2.18 μm and the diagonal length L of 2.69 mm.

In each of the samples, both on resistance R and chip warpage W were measured, or only chip warpage W was measured. FIG. 4A illustrates the measured values of on resistance R and chip warpage W, with Ag thicknesses a, Si thicknesses b and ratios Q of the samples.

FIG. 4B is a diagram illustrating measured values of on resistances and chip warpage of samples of model B. In model B, a plurality of samples with Si thicknesses b being between 28 μm and 93 μm were produced with respect to each of Ag thicknesses a of 25 µm, 30 µm and 35 µm. All the samples of model B have epi thickness c of 2.75 µm and the diagonal lengths L of 3.92 mm.

Both of on resistance R and chip warpage W were measured, or only chip warpage W was measured for each of the samples. FIG. 4B illustrates measured values of on resistance R and chip warpage W, with Ag thicknesses a, Si thicknesses b and ratios Q.

FIG. 4C is a diagram illustrating measured values of on resistances and chip warpage of samples of model C. For model C, a plurality of samples with Si thicknesses b being between 28 µm and 93 µm were produced with respect to each of Ag thicknesses a of 25 µm, 30 µm and 35 µm. All the samples of model C have epi thickness c of 2.18 µm, and diagonal lengths L of 3.63 mm.

For each of the samples, both on resistance R and chip warpage W were measured, or only chip warpage W was measured. FIG. 4C shows measured values of on resistances R and chip warpage W, with Ag thicknesses a, Si thicknesses b and ratios Q of the samples.

Hereinafter, based on measurement results shown in FIG. 4A to FIG. 4C, various favorable conditions of ratio Q is defined from a plurality of different viewpoints.

(Achievement Condition of on Resistance Specification Maximum Value and Chip Warpage Specification Maximum Value in all Models)

Figure 5:
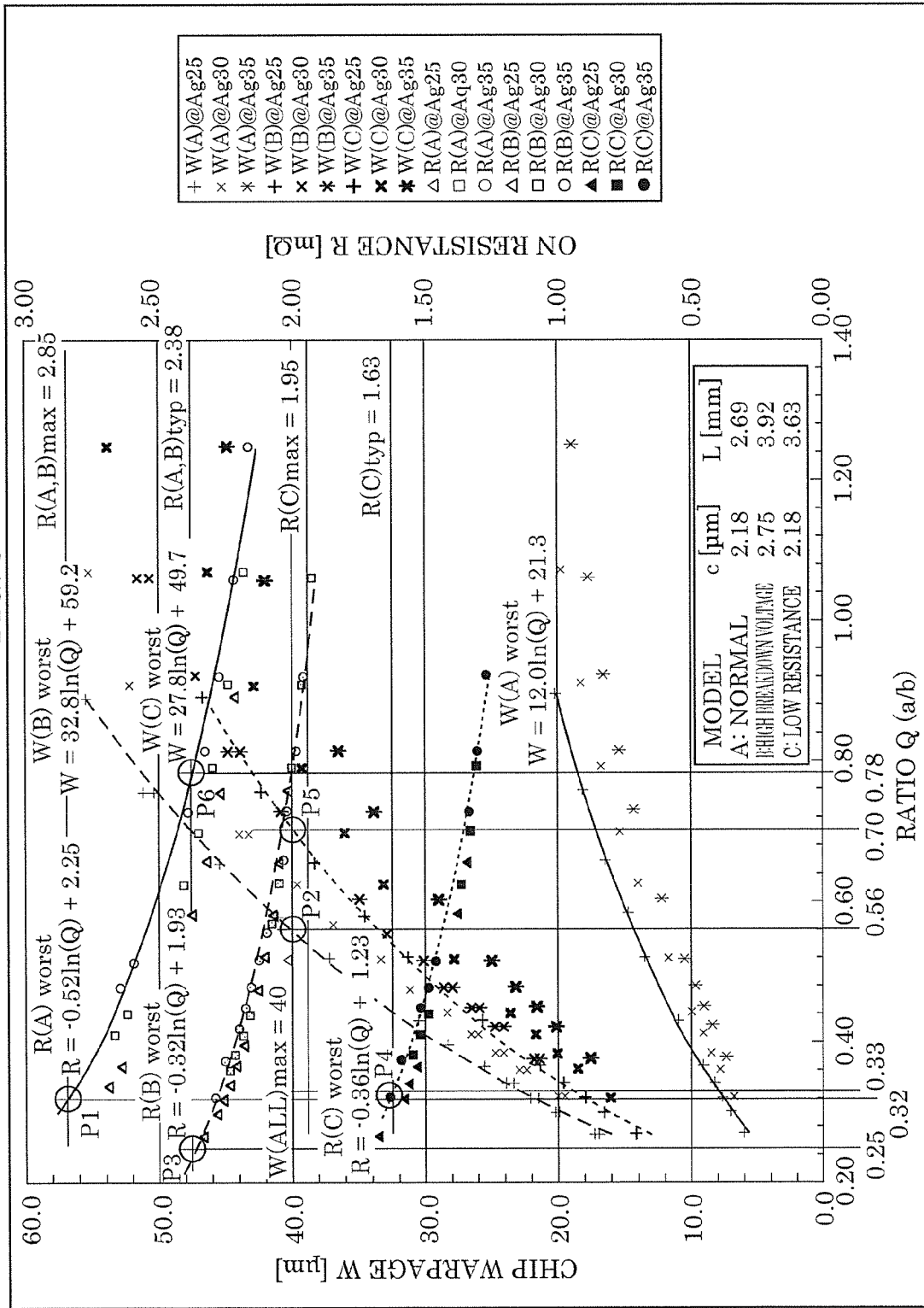
FIG. 5 is a graph illustrating dependence of chip warpage W on ratio Q and dependence of on resistance R on ratio Q.

FIG. 5 is a graph illustrating dependence of chip warpage W on ratio Q and dependence of on resistance R on ratio Q. A vertical axis at a left side in FIG. 5 represents chip warpage W, a vertical axis at a right side represents on resistance R, and a horizontal axis represents ratio Q.

In FIG. 5, all the measurement results shown in FIG. 4A to FIG. 4C are plotted.

In all of models A, B and C, among the samples with same ratio Q, samples having thinner Ag thickness a have larger chip warpage W, and the sample with Ag thickness a=25 µm is located at an upper limit (worst value) of a distribution of chip warpage W. It is considered that chip warpage W is large because the sample with thin Ag thickness a also has thin Si thickness b. Thus, the regression curves of chip warpage W of the samples with Ag thickness of 25 µm of the respective models are obtained, and are used as curves W(A) worst, W(B) worst, and W(C) worst expressing worst values of chip warpage W. Mathematical expressions expressing the respective curves are described in the graphs.

Further, in all of models A, B and C, among the samples with same ratio Q, the samples with thicker Ag thickness a have larger on resistance R, and the sample with Ag thickness a=35 µm is located at an upper limit (worst value) of a distribution of on resistance R. It is considered that on resistance R becomes large because in the samples with thick Ag thickness a, Si thickness b is also thick. Thus, the regression curves of on resistance R of samples with Ag thickness of 35 µm of the respective models are obtained, and are used as curves R(A) worst, R(B) worst, and R(C) worst that express worst values of on resistance R. Mathematical expressions expressing the respective curves are described in the graphs.

FIG. 5 further shows line R (A, B) max showing an on resistance specification maximum values and line R (A, B) typ showing an on resistance specification standard value of models A and B. Further, FIG. 5 shows line R(C) max showing an on resistance specification maximum value and line R(C) typ showing an on resistance specification standard value of model C. Further, FIG. 5 shows line W(ALL) max showing a chip warpage specification maximum value of all the models.

Here, attention is paid to intersection point P1 of curve R(A) worst and line R(A, B) max. Ratio Q=0.32 in intersection point P1 is a minimum value of ratio Q with which a multi-transistor chip of model A achieves an on resistance specification maximum value of 2.85 mΩ. That is, the multi-transistor chip of model A that satisfies ratio Q≥0.32 achieves the on resistance specification maximum value of 2.85 mΩ.

In ratio Q≥0.32, curve R(B) worst is below line R(A, B) max, and curve R(C) worst is below line R(C) max. Accordingly, on resistances R of multi-transistor chips of models B and C that satisfy ratio Q≥0.32 achieve respective on resistance specification maximum values 2.85 mΩ and 1.95 mΩ.

From these results, a semiconductor device according to an aspect of the present disclosure is a multi-transistor chip according to the embodiment, and ratio Q of the thickness of the backside electrode to the thickness of the semiconductor layer including the semiconductor substrate and the low-concentration impurity layer is 0.32 or more.

According to the configuration, in any of the multi-transistor chips of models A, B and C according to the embodiment, on resistance R is equal to or less than an on resistance specification maximum value of the model.

Next, attention is paid to intersection point P2 of curve W(B) worst and line W(ALL) max. Ratio Q=0.56 in intersection point P2 is a maximum value of ratio Q with which a multi-transistor chip of model B achieves a chip warpage specification maximum value of 40 µm. That is, the multi-transistor chip of model B that satisfies ratio Q≤0.56 achieves a chip warpage specification maximum value of 40 µm.

In ratio Q≤0.56, both of curves W(A) worst and W(C) worst are below line WALL) max. Accordingly, chip warpages W of multi-transistor chips of both models A and C that satisfy ratio Q≤0.56 achieve the chip warpage specification maximum value of 40 µm.

From these results, in addition to the lower limit 0.32 of ratio Q described above, an upper limit 0.56 of ratio Q may be provided. Specifically, a semiconductor device according to an aspect of the present disclosure is a multi-transistor chip according to the embodiment, and ratio Q of the thickness of the backside electrode to the thickness of the semiconductor layer including the semiconductor substrate and the low-concentration impurity layer may be at least 0.32 and at most 0.56.

According to the configuration, in any one of the multi-transistor chips of models A, B and C according to the embodiment, on resistance R is equal to or less than an on resistance specification maximum value of the model, and chip warpage is equal to or less than a chip warpage specification maximum value.

In a semiconductor device according to an aspect of the present disclosure, the thickness of the low-concentration impurity layer may be 2.75 µm or more.

According to the configuration, as described in advance, the drain breakdown voltage of multi-transistor chip 1 can be made 20 V. The drain breakdown voltage is determined by thickness c of low-concentration impurity layer 33 from a generation principle of the drain breakdown voltage, and does not depend on a package size (diagonal length L). Consequently, limitations on thickness c of low-concentration impurity layer 33 of 2.75 µm or more is also applied to all the multi-transistor chips of models A, B and C which differ in diagonal length L from one another, and the drain breakdown voltages of the multi-transistor chips can be increased to 20 V.

(Favorable Condition of Ratio Q Dependent on Diagonal Length L)

In the above description, the lower limit value of ratio Q that achieves the on resistance specification maximum value and the upper limit value of ratio Q that achieves the chip warpage specification maximum value are defined by constants in all the models. In contrast with this, hereinafter, defining the lower limit value and the upper limit value of ratio Q by depending on diagonal length L (that is, by a function of diagonal length L) will be discussed.

As described in advance, in FIG. 5, ratio Q=0.56 in intersection point P2 of curve W(B) worst and line W(ALL) max is a maximum value of ratio Q with which the multi-transistor chip of model B achieves chip warpage specification maximum value of 40 μm. Likewise, ratio Q=0.70 in intersection point P5 of curve W(C) worst and line W(ALL) max is a maximum value of ratio Q with which the multi-transistor chip of model C achieves chip warpage specification maximum value of 40 μm.

Here, diagonal lengths L of the multi-transistor chips of models B and C are respectively 3.92 mm and 3.63 mm, so that ratios Q that are 0.56 and 0.70 in intersection points P2 and P5 are linearly interpolated (proportionally allotted) with respect to diagonal length L. In the multi-transistor chips of models B and C, epi thicknesses are different from each other, and are 2.75 μm and 2.18 μm respectively, but the epi thicknesses do not substantially influence chip warpage, so that the interpolation is effective.

Figure 6:
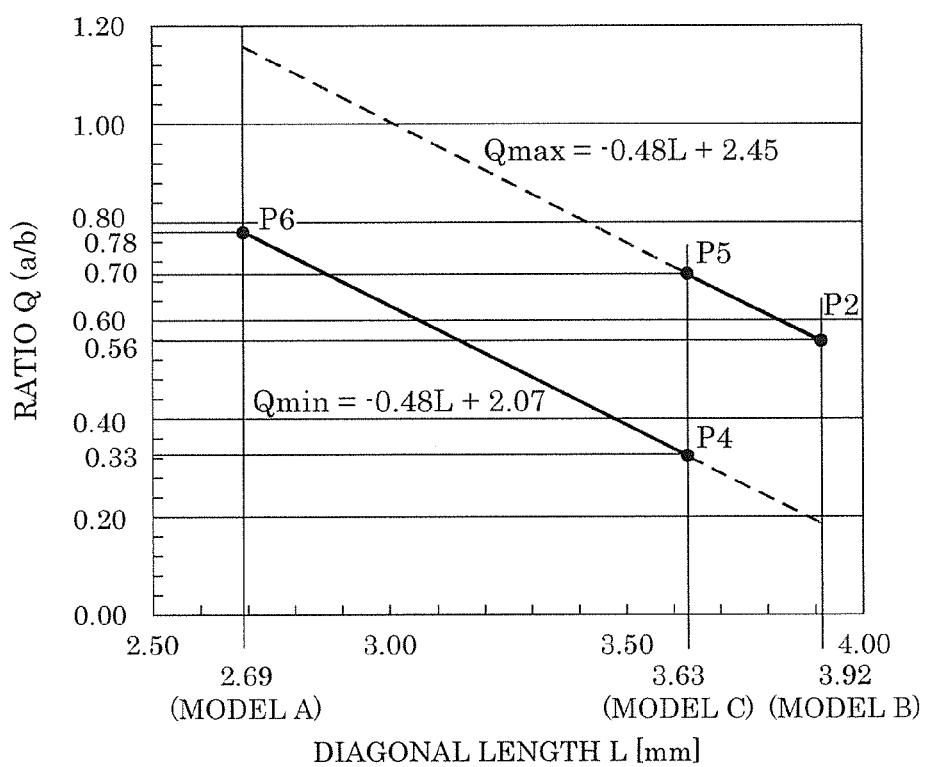
FIG. 6 is a graph illustrating dependence of ratio Q on diagonal length L.

FIG. 6 is a graph illustrating dependence of ratio Q on diagonal length L. In FIG. 6, a vertical axis represents ratio Q, and a horizontal axis represents diagonal length L. Line Qmax shown at an upper side in FIG. 6 is a line obtained by linearly interpolating coordinate points constituted of ratios Q in respective intersection point P2 and intersection point P5 in FIG. 5 and diagonal lengths L of corresponding samples, and is expressed as Qmax=−0.48L+2.45. An extrapolation portion of Qmax is shown by a broken line.

A point on line Qmax is a maximum value of ratio Q with which the multi-transistor chip of diagonal length L achieves the chip warpage specification maximum value of 40 μm. That is, the multi-transistor chip of diagonal length L that satisfies ratio Q≤−0.48L+2.45 achieves the chip warpage specification maximum value of 40 μm.

From this result, a semiconductor device according to an aspect of the present disclosure is a multi-transistor chip according to the embodiment, and when the diagonal dimension of the semiconductor substrate is set as L mm, the ratio of the thickness of the backside electrode to the thickness of a semiconductor layer including the semiconductor substrate and the low-concentration impurity layer is (−0.48×L+2.45) or less.

According to the configuration, in the multi-transistor chip having diagonal length L according to the embodiment, chip warpage is equal to or less than the chip warpage specification maximum value of 40 μm.

Note that chip warpage does not depend on the conductivity type of a semiconductor. Accordingly, the aforementioned configuration that achieves the chip warpage specification maximum value is applied regardless of whether the multi-transistor chip is of an N-channel type or a P-channel type.

Next, a lower limit value of dependence of ratio Q on diagonal length L will be defined. Here, from a viewpoint of achieving the on resistance specification standard value, attention is paid to intersection point P4 of curve R(C) worst and line R(C) typ, and intersection point P6 of curve R(A) worst and line R(A) typ in FIG. 5. Ratio Q=0.33 in intersection point P4 is a minimum value of ratio Q with which the multi-transistor chip of model C achieves an on resistance specification standard value of 1.63 mΩ. Ratio Q=0.78 in intersection point P6 is a minimum value of ratio Q with which the multi-transistor chip of model A achieves an on resistance specification standard value of 2.38 mΩ.

Here, since diagonal lengths L of the multi-transistor chips of models A and C are respectively 2.69 mm and 3.63 mm, ratios Q that are 0.33 and 0.78 in intersection points P4 and P6 are linearly interpolated with respect to diagonal length L. The epi thicknesses that influence the on resistances are both 2.18 μm and equal among the multi-transistor chips of models A and C, so that the interpolation is effective.

Line Qmin shown at a lower side in FIG. 6 is a line obtained by linearly interpolating coordinate points constituted of ratios Q in respective intersection point P4 and intersection point P6 in FIG. 5 and diagonal lengths L of corresponding samples, and is expressed as Qmin=−0.48L+2.07. An extrapolation portion of Qmin is shown by a broken line.

A point on line Qmin is a minimum value of ratio Q with which the multi-transistor chip with diagonal length L achieves the on resistance specification standard value. That is, the multi-transistor chip with diagonal length L that satisfies ratio Q≥−0.48L+2.07 achieves the on resistance specification standard value.

From these results, a semiconductor device according to an aspect of the present disclosure is a multi-transistor chip according to the embodiment, and when the diagonal dimension of the semiconductor substrate is set as L mm, the ratio of the thickness of the backside electrode to the thickness of a semiconductor layer including the semiconductor substrate and the low-concentration impurity layer is (−0.48×L+2.07) or more.

According to the configuration, in the multi-transistor chip having diagonal length L according to the embodiment, the on resistance R is equal to or less than an on resistance specification standard value.

The upper limit value and the lower limit value of dependence of ratio Q on diagonal length L defined in the above may be used in combination. That is, in a semiconductor device according to an aspect of the present disclosure, when a diagonal dimension of the semiconductor substrate is L mm, ratio Q of the thickness of a backside electrode to the thickness of the semiconductor layer including the semiconductor substrate and the low-concentration impurity layer may be (−0.48L+2.07) to (−0.48L+2.45) inclusive.

According to the configuration, in the multi-transistor chip having diagonal length L according to the embodiment, on resistance R is equal to or less than the on resistance specification standard value, and the chip warpage is equal to or less than the chip warpage specification maximum value.

(Favorable Condition of Ratio Q of Each Model)

In the above, the favorable condition of ratio Q which is applied to all the models in common is defined. In contrast with this, a favorable condition of ratio Q that is applied to only any one of models A, B and C will be discussed hereinafter.

(Favorable Condition of Ratio Q in Model A)

A favorable condition of ratio Q that is applied to only the multi-transistor chip of model A will be discussed.

First, from a viewpoint of achieving the on resistance specification standard value of the multi-transistor chip of model A, attention is paid to intersection point P6 in FIG. 5 again. Ratio Q=0.78 in intersection point P6 is a minimum value of ratio Q with which the multi-transistor chip of model A achieves an on resistance specification standard value of 2.38 mΩ. That is, the multi-transistor chip of model A that satisfies ratio Q≥0.78 achieves an on resistance specification standard value of 2.38 mΩ.

Application of the condition of ratio Q≥0.78 to the multi-transistor of model A is clarified by defining the condition of ratio Q≥0.78 on a precondition. The precondition is the size of model A in which epi thickness c is 2.18 μm or less and diagonal length L is 2.69 mm or more.

From these results, a semiconductor device according to an aspect of the present disclosure is a multi-transistor chip according to the embodiment, and when the thickness of the low-concentration impurity layer is 2.18 μm or less and the diagonal dimension of the semiconductor substrate in a plan view is 2.69 mm or more, ratio Q of the thickness of the backside electrode to the thickness of the semiconductor layer including the semiconductor substrate and the low-concentration impurity layer is 0.78 or more.

According to the configuration, in a multi-transistor chip of model A according to the embodiment, the on resistance specification standard value is achieved.

Next, as for the multi-transistor chip of model A, it is considered to define ratio Q to achieve the on resistance specification standard value by compensating increase of on resistance R due to dimensional variation of epi thickness c or diagonal length L. Specifically, with epi thickness c or diagonal length L having a dimensional error that increases on resistance R as a precondition, ratio Q that realizes on resistance smaller than the on resistance specification standard value is defined. Increase and decrease of on resistance are cancelled out by matching an increase amount of the on resistance due to a dimensional error of epi thickness c or diagonal length L with a decrease amount of the on resistance defined by ratio Q from the on resistance specification standard value, and the on resistance specification standard value is achieved. For convenience of understanding, the increase and decrease amount of the on resistance to be cancelled out will be described as 0.1 mΩ as an example hereinafter.

Figure 7:
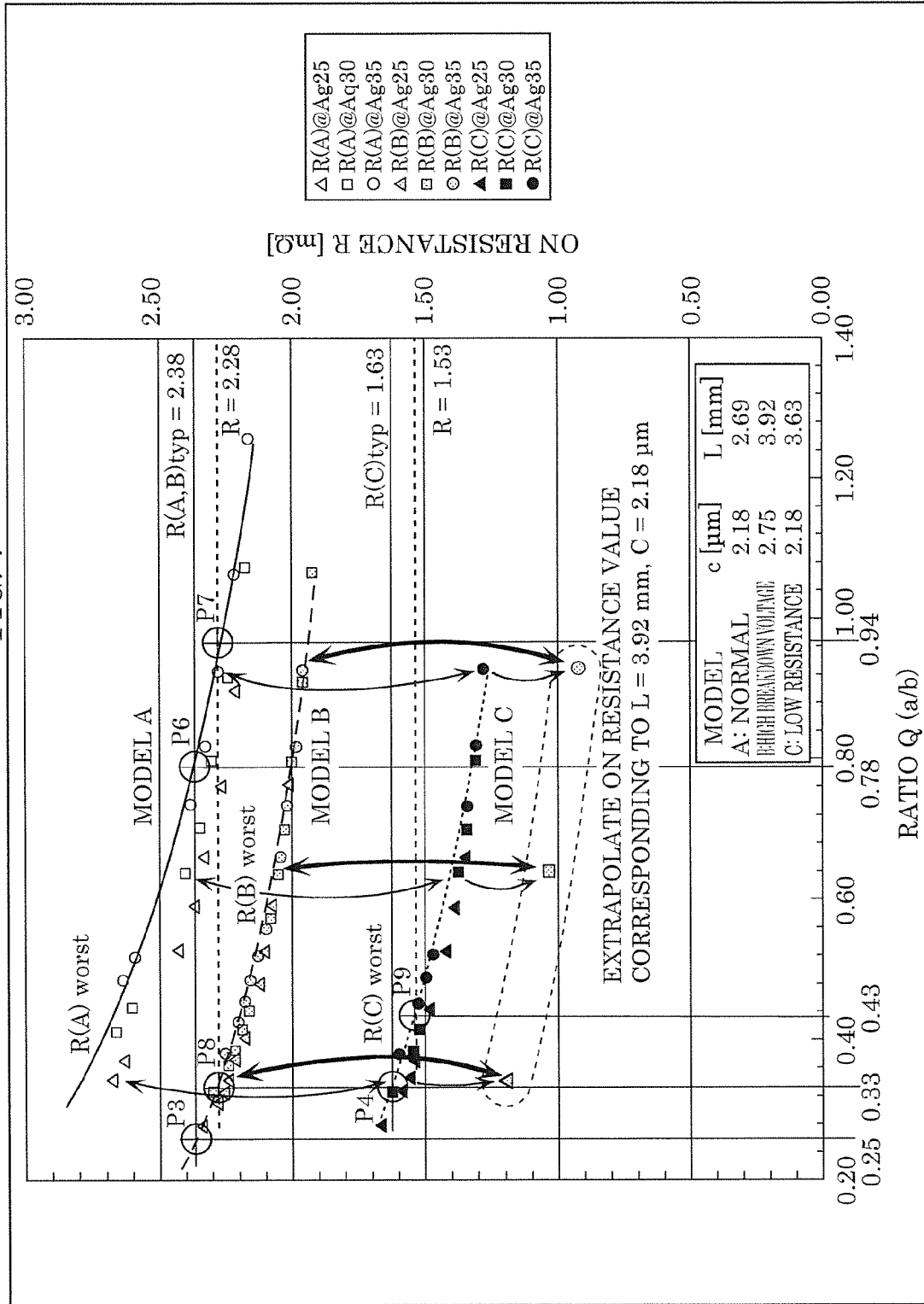
FIG. 7 is a graph explaining derivation of ratio Q that compensates a dimensional variation of an epi thickness or a diagonal length.

FIG. 7 is a graph explaining derivation of ratio Q that cancels out excessive on resistance due to a dimensional variation of epi thickness c or diagonal length L.

First, an error of epi thickness c and a dimensional error of diagonal length L that increase the on resistance by 0.1 mΩ are calculated as follows.

A sample group in which samples with same Ag thickness a and same ratio Q are available with respect to models A, B and C is selected.

An on resistance value corresponding to epi thickness c=2.18 μm and diagonal length L=3.92 mm is extrapolated (broken line enclosure in FIG. 7) by proportionally allotting on resistance R of the sample of model A (epi thickness c=2.18 μm, diagonal length L=2.69 mm), and on resistance R of the sample of model C (epi thickness c=2.18 μm, diagonal length L=3.63 mm) in diagonal length L (thin arrows in FIG. 7). A value of diagonal length L corresponding to 0.1 mΩ is obtained from a proportionality factor of diagonal length L and on resistance R calculated at this time. According to experimental data of the present disclosure, the value of diagonal length L is found as 0.08 mm. This means that when diagonal length L decreases by 0.08 mm with same epi thickness c, on resistance R increases by 0.1 mΩ at the maximum.

A proportionality factor of epi thickness c and on resistance R is obtained (thick arrows in FIG. 7) from on resistance R which is extrapolated (corresponding to epi thickness c=2.18 μm, and diagonal length L=3.92 mm) and on resistance R of the sample of model B (epi thickness c=2.75 μm, diagonal length L=3.92 mm), and epi thickness c corresponding to 0.1 mΩ is obtained. According to the experimental data of the present disclosure, epi thickness c is obtained as 0.06 μm. This means that when epi thickness c increases by 0.06 μm with same diagonal length L, on resistance R increases by 0.1 mΩ at the maximum.

From the above, it is estimated that the on resistance in a case where epi thickness c is 2.18 μm or less and diagonal length L is 2.61 mm to 2.69 mm inclusive, or the epi thickness is 2.18 μm to 2.24 μm inclusive and diagonal length L is 2.69 mm or more increases by 0.1 mΩ at the maximum as compared with on resistance in a typical size in which epi thickness c is 2.18 μm or less and diagonal length L is 2.69 mm or more.

Based on the understanding, ratio Q with which on resistance R=2.28 mΩ that is smaller than the on resistance specification standard value of 2.38 mΩ by 0.1 mΩ is obtained in the multi-transistor chip of model A is applied under a condition where increase of on resistance by 0.1 mΩ is estimated at the maximum. Note that as for ratio Q with which on resistance R=2.28 mΩ is obtained, on resistance R=2.28 mΩ is obtained specifically by ratio Q=0.94 in intersection point P7 of curve R(A) worst in FIG. 7, and line R=2.28 mΩ that is obtained by shifting down line R(A, B) typ by 0.1 mΩ.

From these results, a semiconductor device according to an aspect of the present disclosure is a multi-transistor chip according to the embodiment, when the thickness of the low-concentration impurity layer is 2.18 μm or less and the diagonal dimension of the semiconductor in a plan view ranges from 2.61 mm to 2.69 mm, inclusive, or when the thickness of the low-concentration impurity layer ranges from 2.18 μm to 2.24 μm, inclusive, and the diagonal dimension of the semiconductor substrate in a plan view is 2.69 mm or more, the ratio of the thickness of a backside electrode to the thickness of the semiconductor layer including the semiconductor substrate and the low-concentration impurity layer is may be 0.94 or more.

According to the configuration, even when a multi-transistor chip of model A according to the embodiment has a predetermined dimensional error, the on resistance R is equal to or less than an on resistance specification standard value of model A.

(Favorable Condition of Ratio Q in Model B)

Next, a favorable condition of ratio Q that is applied only to the multi-transistor chip of model B will be discussed.

First, from a viewpoint of achieving the on resistance specification standard value of the multi-transistor chip of model B, attention is paid to intersection point P3 of curve R(B) worst and line R(A, B) typ in FIG. 5. Ratio Q=0.25 in intersection point P3 is a minimum value of ratio Q with which the multi-transistor chip of model B achieves an on resistance specification standard value of 2.38 mΩ That is, the multi-transistor chip of model B that satisfies ratio Q≥0.25 achieves an on resistance specification standard value of 2.38 mΩ.

Application of the condition of ratio Q≥0.25 to the multi-transistor of model B is clarified by defining the condition of ratio Q≥0.25 on a precondition. The precondition is the size of model B in which epi thickness c is 2.75 μm or less, and diagonal length L is 3.92 mm or more.

From these results, a semiconductor device according to an aspect of the present disclosure is a multi-transistor chip according to the embodiment, and when the thickness of the low-concentration impurity layer is 2.75 µm or less, and a diagonal dimension of the semiconductor substrate in a plan view is 3.92 mm or more, ratio Q of the thickness of the backside electrode to the thickness of the semiconductor layer including the semiconductor substrate and the low-concentration impurity layer is 0.25 or more.

According to the configuration, in a multi-transistor chip of model B according to the embodiment, an on resistance specification standard value is achieved.

Next, with respect to the multi-transistor chip of model B, ratio Q is defined to achieve the on resistance specification standard value by compensating increase of on resistance R due to a dimensional variation of epi thickness c or diagonal length L. In the same way of thinking as in model A, ratio Q with which the on resistance that is lower than the on resistance specification standard value by 0.1 mΩ is obtained in the multi-transistor chip of model B is applied under the condition in which increase of on resistance by 0.1 mΩ at the maximum is estimated.

In the multi-transistor chip of model B, in a case where epi thickness c is 2.75 µm or less and diagonal length L is 3.84 mm to 3.92 mm inclusive, or epi thickness c is 2.75 µm to 2.81 µm inclusive and diagonal length L is 3.92 mm or more, the on resistance in the case is estimated to increase by 0.1 mΩ at the maximum as compared with the on resistance in a regular size in which epi thickness c is 2.75 µm or less and diagonal length L is 3.92 mm or more.

Based on the understanding, ratio Q with which on resistance R=2.28 mΩ that is smaller than the on resistance specification standard value of 2.38 mΩ by 0.1 mΩ is obtained in the multi-transistor chip of model B is applied under a condition in which increase of the on resistance by 0.1 mΩ at the maximum is estimated. As for ratio Q with which on resistance R=2.28 mΩ is obtained, on resistance R=2.28 mΩ is obtained specifically by ratio Q=0.33 in intersection point P8 of curve R(B) worst in FIG. 7, and line R=2.28 mΩ obtained by shifting down line R(C) typ by 0.1 mΩ.

From this result, a semiconductor device according to an aspect of the present disclosure is a multi-transistor chip according to the embodiment, and when the thickness of the low-concentration impurity layer is 2.75 µm or less and the diagonal dimension ranges from 3.84 mm to 3.92 mm, inclusive, or when the thickness of the low-concentration impurity layer ranges from 2.75 µm to 2.81 µm, inclusive, and the diagonal dimension of the semiconductor substrate in a plan view is 3.92 mm or more, the ratio of the thickness of the backside electrode to the thickness of the semiconductor layer including the semiconductor substrate and the low-concentration impurity layer is 0.33 or more.

According to the configuration, even when a multi-transistor chip of model B according to the embodiment has a predetermined dimensional error, on resistance R is equal to or less than the on resistance specification standard value of model B.

Further, in the multi-transistor chip of model B, ratio Q may be set as 0.56 or less from a viewpoint of achieving the chip warpage specification maximum value. Ratio Q=0.56 is obtained from intersection point P2 in FIG. 5.

According to the configuration, in a multi-transistor chip of model B according to the embodiment, a chip warpage specification maximum value is achieved.

(Favorable Condition of Ratio Q in Model C)

Next, a favorable condition of ratio Q that is applied only to the multi-transistor chip of model C will be discussed.

First, from a viewpoint of achieving the on resistance specification standard value of the multi-transistor chip of model C, attention is paid to intersection point P4 in FIG. 5 again. Ratio Q=0.33 in intersection point P4 is a minimum value of ratio Q with which the multi-transistor chip of model C achieves an on resistance specification standard value of 1.63 mΩ. That is, the multi-transistor chip of model C that satisfies ratio Q≥0.33 achieves an on resistance specification standard value of 1.63 mΩ.

Application of the condition of ratio Q≥0.33 to the multi-transistor of model C is clarified by defining the condition of ratio Q≥0.33 on a precondition. The precondition is a size of model C in which epi thickness c is 2.18 µm or less, and diagonal line L is 3.63 mm or more.

From this result, a semiconductor device according to an aspect of the present disclosure is a multi-transistor chip according to the embodiment, and when the thickness of the low-concentration impurity layer is 2.18 µm or less and the diagonal dimension of the semiconductor substrate in a plan view is 3.63 mm or more, ratio Q of the thickness of the backside electrode to the thickness of the semiconductor layer including the semiconductor substrate and the low-concentration impurity layer is 0.33 or more.

According to the configuration, in a multi-transistor chip of model C according to the embodiment, an on resistance specification standard value is achieved.

Next, as for the multi-transistor chip of model C, ratio Q is defined to achieve the on resistance specification standard value by compensating increase of on resistance R due to a dimensional variation of epi thickness c or diagonal length L. In the same way of thinking as in model A, ratio Q with which the on resistance lower than the on resistance specification standard value by 0.1 mΩ in the multi-transistor chip of model C is applied under the condition in which increase of the on resistance by 0.1 mΩ at the maximum is estimated.

In the multi-transistor chip of model C, in a case where epi thickness c is 2.18 µm or less and diagonal length L is 3.55 mm to 3.63 mm inclusive, or epi thickness c is 2.18 µm to 2.24 µm inclusive, and diagonal length L is 3.63 mm or more, an on resistance in the case is estimated to increase by 0.1 mΩ at the maximum as compared with the on resistance in a regular size in which epi thickness c is 2.18 µm or less and diagonal length L is 3.63 mm or more.

Based on the above understanding, ratio Q with which on resistance R=1.53 mΩ that is smaller than on resistance specification standard value of 1.63 mΩ by 0.1 mΩ in the multi-transistor chip of model C is applied under a condition in which increase of on resistance by 0.1 mΩ at the maximum is estimated. As for ratio Q with which on resistance R=1.53 mΩ is obtained, on resistance R=1.53 mΩ is obtained specifically by ratio Q=0.43 in intersection point P9 of curve R(C) worst in FIG. 7 and line R=1.53 mΩ obtained by shifting down line R(C) typ by 0.1 mΩ.

From this result, a semiconductor device according to an aspect of the present disclosure is a multi-transistor chip according to the embodiment, and when the thickness of the low-concentration impurity layer is 2.18 µm or less and the diagonal dimension of the semiconductor substrate in a plan view ranges from 3.55 mm to 3.63 mm, inclusive, or when the thickness of the low-concentration impurity layer ranges from 2.18 µm to 2.24 µm, inclusive, and the diagonal dimension of the semiconductor substrate in a plan view is 3.63 mm or more, the ratio of the thickness of the backside electrode to the thickness of the semiconductor layer including the semiconductor substrate and the low-concentration impurity layer is 0.43 or more.

According to the configuration, in a multi-transistor chip of model C according to the embodiment, on resistance R is equal to or less than the on resistance specification standard value of model C.

Further, in the multi-transistor chip of model C, ratio Q may be set as 0.70 or less from a viewpoint of achieving the chip warpage specification maximum value. Ratio Q=0.70 is obtained from intersection point P5 in FIG. 5.

According to the configuration, in a multi-transistor chip of model C according to the embodiment, a chip warpage specification maximum value is achieved.

(Favorable Condition Concerning Ratio of Thickness of First and Second Source Electrodes, and Thickness of Backside Electrode)

Referring to FIG. 1 again, a favorable condition concerning a ratio of thickness of first source electrode 11 and second source electrode 21, and thickness of backside electrode 31 will be described.

First portions 12 and 22 of first and second source electrodes 11 and 21 are provided to have a sufficient thickness with which favorable bonding performance with a conductive bonding material such as solder is obtained at a time of mounting.

Further, second portion 13 of first source electrode 11 is provided to have a sufficient thickness with which connection of first portion 12 of first source electrode 11 to the semiconductor layer can be taken, and second portion 23 of second source electrode 21 is provided to have a sufficient thickness with which connection of first portion 22 of second source electrode 21 to the semiconductor layer can be taken.

Further, it is known that as second portions 13 and 23 become thicker, the on resistance of the multi-transistor chip decreases. This is confirmed by an experiment in which a plurality of samples differing in thickness of second portions 13 and 23 are produced, and the on resistance of each of the samples is measured. The on resistance rapidly reduces between the thicknesses of second portions 13 and 23 of 2 µm and 4 µm, and reduction becomes slow when the thicknesses are 4 µm or more.

Further, the thicknesses of all of first portions 12 and 22 and second portions 13 and 23 may be thinner from viewpoints of material cost and manufacturing cost.

As a result of considering a design example that can be applied to all of models A, B and C, and achieves bonding performance with the conducting bonding material, a lower on resistance, and cost reduction in a well-balanced way, based on the above knowledge, a favorable condition that the thicknesses of first portions 12 and 22 are set as 3 µm, and the thicknesses of second portions 13 and 23 are set as 4 µm has been found out. Thicknesses d1 and d2 of first and second source electrodes 11 and 21 in this case are both 7 µm.

In the multi-transistor chips in which both thicknesses d1 and d2 of first and second source electrodes 11 and 21 are 7 µm, and the thicknesses of backside electrodes 31 are 25 µm, 30 µm and 35 µm, ratios of the thicknesses of first and second source electrodes 11 and 21 to backside electrodes 31 are 0.28, 0.23 and 0.20, respectively.

From these results, a semiconductor device according to an aspect of the present disclosure is a multi-transistor chip according to this embodiment, and the ratio of the thickness of the first source electrode to the thickness of the backside electrode is 0.28 or less, and the ratio of the thickness of the second source electrode to the thickness of the backside electrode is 0.28 or less.

According to the configuration, with respect to the thicknesses 25 µm, 30 µm and 35 µm of backside electrode 31, favorable thicknesses of first source electrode 11 and second source electrode 12 are defined, so that the multi-transistor chip is obtained, in which the bonding performance with the conductive bonding material, lower on resistance and cost reduction are achieved in a well-balanced way.

The ratio of the thicknesses of first and second source electrodes 11 and 12, and backside electrode 31 does not depend on the conductivity type of the semiconductor. Accordingly, the aforementioned configuration is applied regardless of whether the multi-transistor chip is of an N-channel type or a P-channel type.

(Electrode Disposition that Reduces on Resistance)

Next, electrode disposition that reduces the on resistance will be described.

Figure 8A:
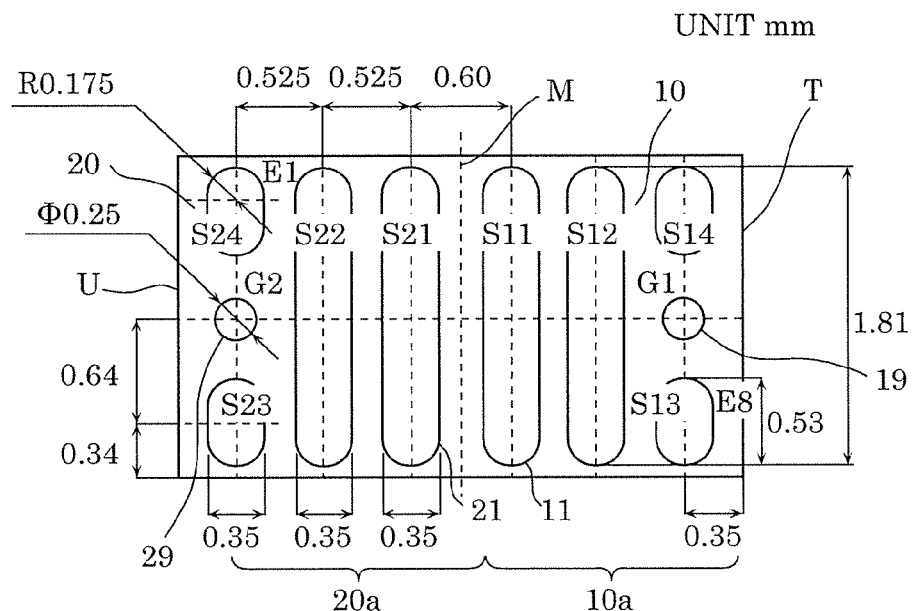
FIG. 8A is a top view illustrating an example of an electrode shape of a multi-transistor chip of model B.
Figure 8B:
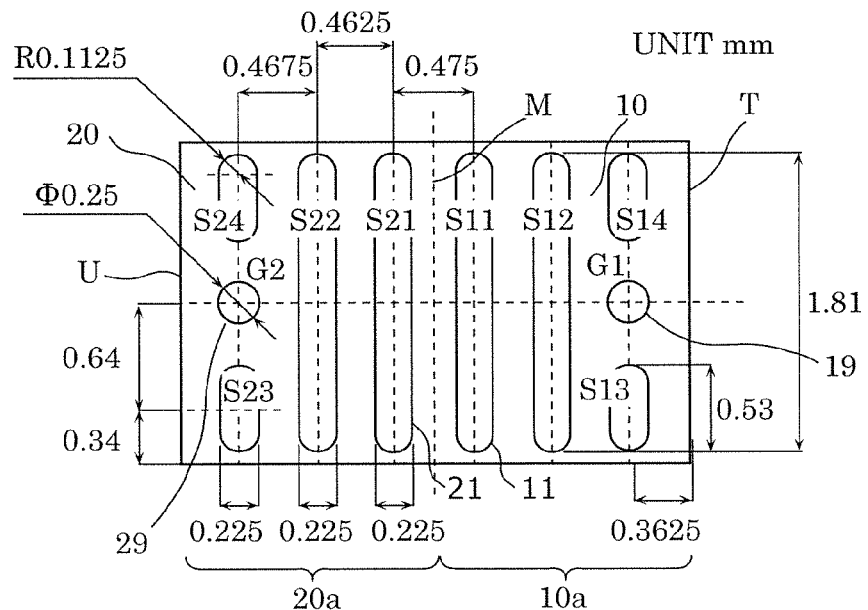
FIG. 8B is a top view illustrating an example of an electrode shape of a multi-transistor chip of model C.

FIG. 8A and FIG. 8B are top views respectively illustrating examples of electrode dispositions of multi-transistor chips of model B and model C. FIG. 8A and FIG. 8B each shows dimensions of essential parts of electrodes in a unit of millimeter. Note that in FIG. 8A and FIG. 8B, the S pads and G pads in explanation of FIG. 3 are illustrated as electrodes.

In FIG. 8A and FIG. 8B, oblong electrodes are first source electrodes 11 and second source electrodes 21, and circular electrodes are first gate electrodes 19 and second gate electrodes 29. First source electrode 11 includes first source electrodes S11 to S14, and second source electrode 21 includes second source electrodes S21 to S24. First gate electrode 19 includes first gate electrode G1, and second gate electrode 29 includes second gate electrode G2.

As illustrated in FIG. 8A and FIG. 8B, first source electrode S11 and second source electrode S21 are disposed along an entirety of boundary M between first region 10a in which transistor 10 is formed and second region 20a in which transistor 20 is formed.

Here, the entirety may be a portion that occupies 90% or more of a total length of boundary M. In a specific example of each of FIG. 8A and FIG. 8B, while the total length (dimension in a vertical direction of the chip) of boundary M is 1.96 mm, lengths of first electrode S11 and second source electrode S21 are 1.81 mm, respectively, and occupy 92% of the entire length of boundary M. Further, being disposed along boundary M may be defined as being extended in a same direction as boundary M, with no other electrode being present between boundary M and first source electrode S11, and between boundary M and second source electrode S21.

Thereby, the path of a current flowing in transistor 10 and transistor 20 becomes wider and shorter, so that the on resistance of the multi-transistor chip can be reduced.

Further, as illustrated in FIG. 8A, an interval between first source electrode S11 and second source electrode S21 may be narrower than either of the widths of first source electrode S11 and second source electrode S21. In the specific example in FIG. 8A, the interval between first source electrode S11 and second source electrode S21 is 0.25 mm (that is, 0.60 mm-0.35 mm), and is narrower than the 0.35-mm width of each of first source electrode S11 and second source electrode S21.

Thereby, the path of a current flowing in transistor 10 and transistor 20 can be further widened and shortened, so that the on resistance of the multi-transistor chip can be more effectively reduced.

Further, as illustrated in FIG. 8B, the interval between first source electrode S11 and second source electrode S21 may be wider than either of the widths of first source electrode S11 and second source electrode S21. In the specific example of FIG. 8B, the interval between first source electrode S11 and second source electrode S21 is 0.25 mm (that is, 0.475 mm-0.225 mm), and is wider than the 0.225-mm width of each of first source electrode S11 and second source electrode S21.

Thereby, a region where solder is not disposed can be taken widely, so that short circuits between patterns can be avoided while the path of the current flowing in transistor 10 and transistor 20 can be made wider and shorter.

(Electrode Disposition Enhancing Connection Reliability)

Next, electrode disposition that enhances connection reliability will be described.

As illustrated in FIG. 8A and FIG. 8B, in the multi-transistor chips of model B and model C, first source electrodes S11 and S14 are disposed between boundary M and opposite end T of first region 10a which is opposite to boundary M and aligned in a direction that crosses boundary M. The center point of first gate electrode G1 is offset toward opposite end T from boundary-side ends of first source electrodes S13 and S14 that are farthest from boundary M, in first region 10a. Here, the boundary-side ends are the ends of first source electrodes S13 and S14 that are closest to boundary M.

Further, second source electrodes S21 to S24 are disposed between boundary M and opposite end U of second region 20a which is opposite to boundary M and aligned in a direction that crosses boundary M. The center point of second gate electrode G2 is offset toward opposite end U from boundary-side ends of second source electrodes S23 and S24 that are farthest from boundary M in second region 20a. Here, the boundary-side ends are the ends of second source electrodes S23 and S24 that are closest to boundary M Thereby, first gate electrode G1 and second gate electrode G2 are disposed farther from boundary M, so that even if chip warpage occurs to the semiconductor substrate and a vicinity of boundary M is lifted from the mounting substrate, solder open hardly occurs between first gate electrode G1 and second gate electrode G2, and the mounting substrate.

A plurality of characteristic configurations are described above with respect to disposition of the first and second source electrodes and first and second gate electrodes.

Note that disposition of the first and second source electrodes and the first and second gate electrodes do not depend on the conductivity type of the semiconductor. Accordingly, the aforementioned configuration concerning disposition of the first and second source electrodes and the first and second gate electrodes is applied regardless of whether the multi-transistor chip is of an N-channel type or a P-channel type.

(Mounting Structure of Semiconductor Device Excellent in Power Efficiency and Reliability)

Next, a mounting structure of a semiconductor device that reduces on resistance will be described.

Figure 9A:
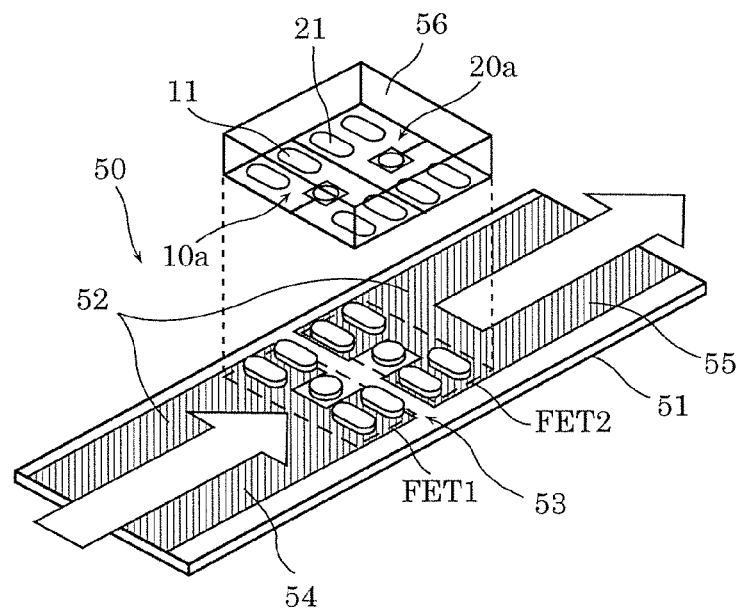
FIG. 9A is a perspective view illustrating an example of a mounting structure of the semiconductor device according to the embodiment.

FIG. 9A is a perspective view illustrating an example of a mounting structure of the multi-transistor chip according to the embodiment, and illustrates an example of semiconductor module 50 in which the multi-transistor chip is mounted.

Semiconductor module 50 includes printed wiring board 51, wiring pattern 52, and semiconductor device 56.

Wiring pattern 52 is provided in a strip-shaped region on printed wiring board 51, and is separated into first section 54 and second section 55 by gap 53 that crosses the longitudinal direction.

Semiconductor device 56 is aforementioned multi-transistor chip 1, and is disposed on gap 53 on printed wiring board 51.

Semiconductor device 56 is disposed in an orientation in which first region 10a and second region 20a align in the longitudinal direction of wiring pattern 52, and first source electrode 11 and second source electrode 21 of semiconductor device 56 are respectively connected to first section 54 and second section 55 of wiring pattern 52.

Figure 9B:
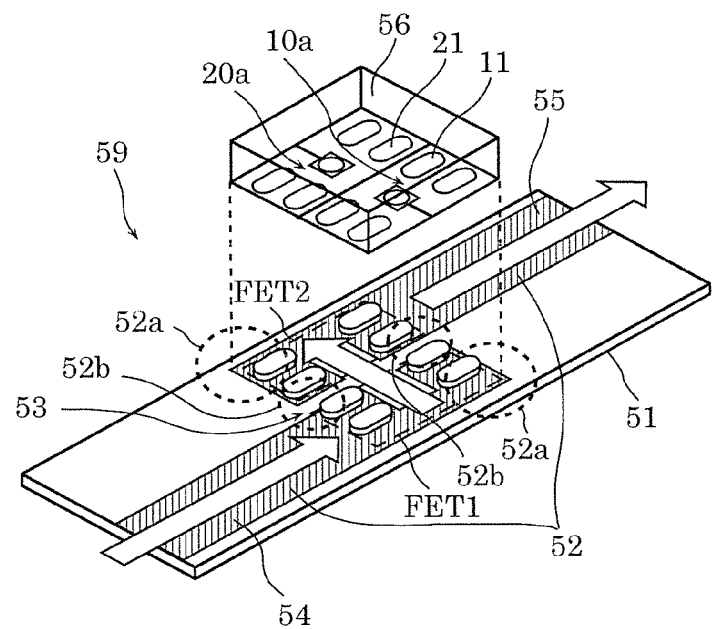
FIG. 9B is a perspective view illustrating an example of a mounting structure of a semiconductor device according to a comparative example.

FIG. 9B is a perspective view illustrating one example of a mounting structure of semiconductor module 59 according to a comparative example. Semiconductor module 59 differs from semiconductor module 50 in that first region 10a and second region 20a of semiconductor device 56 are disposed in an orientation parallel with the longitudinal direction of wiring pattern 52.

Semiconductor modules 50 and 59 may be power supply modules for smartphones. In this case, semiconductor modules 50 and 59 are each disposed in a casing of a smartphone with a short side of printed wiring board 51 standing in a thickness direction of the smartphone. Therefore, a length of the short side of printed wiring board 51, that is, a board width is suppressed to approximately 2 mm. In application like this in which an upper limit of the board width is strictly limited, providing wiring pattern 52 in the entire board width is effective to reduce wiring resistance and enhance power efficiency.

In semiconductor module 50, semiconductor device 56 is disposed in an orientation in which transistors 10 and 20 align in the longitudinal direction of wiring pattern 52, so that connection of wiring pattern 52 provided in the entire board width and semiconductor device 56 can be taken in the entire board width. Therefore, wiring pattern 52 is provided in an entire width of printed wiring board 51, and wiring resistance (including connection resistance with semiconductor device 56) can be effectively reduced.

In contrast with this, in semiconductor module 59, transistors 10 and 20 are disposed in an orientation that crosses the longitudinal direction of wiring pattern 52, so that connection of wiring pattern 52 and semiconductor device 56 can be taken in only a half of the board width, for example. Therefore, even if wiring pattern 52 is provided in the entire board width, connection resistance with semiconductor device 56 cannot be reduced effectively.

Further, in semiconductor module 59, a path of a current is in a crank shape (white arrows in FIG. 9B), so that much current does not flow into portion 52a of wiring pattern 52, and semiconductor device 56 cannot exhibit a capability corresponding to a size. Conversely, currents concentrate on portion 52b of wiring pattern 52, and for example, reduction in reliability of printed wiring board 51 due to electromigration can occur. In semiconductor module 50 in which the path of a current is rectilinear (white arrows in FIG. 9A), a large imbalance does not occur in current density, so that these problems hardly occur.

According to semiconductor module 50 in which semiconductor device 56 is disposed in the orientation in which first region 10a and second region 20a align in the longitudinal direction of wiring pattern 52, that is, the orientation in which transistors 10 and 20 align in the longitudinal direction of wiring pattern 52, the mounting structure of the semiconductor device excellent in power efficiency and reliability can be obtained.

Note that the mounting structure of the semiconductor device described above does not depend on the conductivity type of the semiconductor. Accordingly, the aforementioned configuration is applied regardless whether the multi-transistor chip is of an N-channel type or a P-channel type.

(Packaged Semiconductor Device)

While in the above, multi-transistor chip 1 is described as the chip size package, multi-transistor chip 1 is not limited to the chip size package. Multi-transistor chip 1 may be configured as a packaged semiconductor device by being sealed in a resin package or the like. The packaged semiconductor device like this may be a packaged semiconductor device in which multi-transistor chip 1 illustrated in FIG. 1 and FIG. 2 is simply sealed in a resin package or the like, for example.

That is, the packaged semiconductor device according to an aspect of the present disclosure includes the aforementioned semiconductor device, that is, multi-transistor chip 1, and a package in which multi-transistor chip 1 is sealed and which has a first source external terminal, a first gate external terminal, a second source external terminal, and a second gate external terminal. The first source external terminal, the first gate external terminal, the second source external terminal, and the second gate external terminal of the package are electrically connected respectively to first source electrode 11, first gate electrode 19, second source electrode 21, and second gate electrode 29 of multi-transistor chip 1.

According to the configuration, the packaged semiconductor device is obtained, which has multi-transistor chip 1 excellent in reduction of the on resistance and suppression of chip warpage, and having high durability against environmental conditions.

Next, a packaged semiconductor device having an external terminal connected to a common drain of transistors 10 and 20 of multi-transistor chip 1 will be described.

Figure 10:
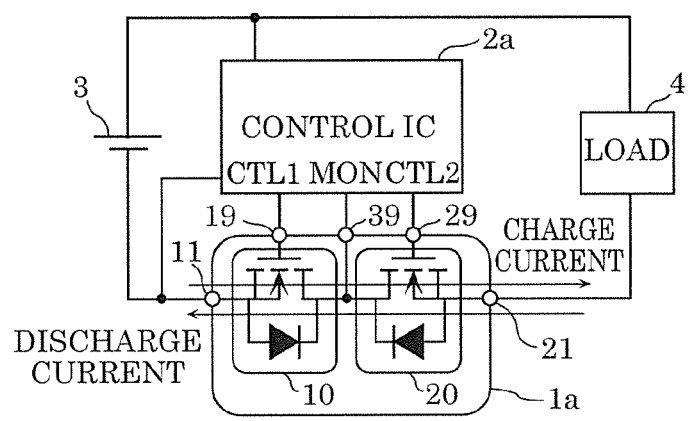
FIG. 10 is a circuit diagram illustrating an example of an application circuit of the multi-transistor chip according to the embodiment.

FIG. 10 is a charge and discharge circuit of a smartphone or the like similarly to FIG. 2, and illustrates a case of using packaged semiconductor device 1*a* with multi-transistor chip 1 sealed in a package by inserting packaged semiconductor device 1*a* into a low side of the charge and discharge circuit, as a charge and discharge switch controlling conduction of two-way currents, as one application example. The application example in FIG. 10 differs from the application example in FIG. 2 in that packaged semiconductor device 1*a* has common drain external terminal 39. Common drain external terminal 39 is electrically connected to backside electrode 31 of multi-transistor chip 1 illustrated in FIG. 1.

In the charge and discharge circuit in FIG. 10, common drain terminal 39 is used as a monitor terminal of a drain voltage common to transistors 10 and 20 of multi-transistor chip 1. When control IC 2*a* controls a charge current and a discharge current of battery 3, control IC 2*a* monitors a voltage of common drain terminal 39, and when the voltage deviates from a normal voltage range (a range of 3.5 V to 4.5 V, for example) of battery 3, control IC 2*a* determines the state as an abnormal state, and stops a charge and discharge operation. Thereby, excessive discharge and excessive charge of battery 3 is prevented.

Further, although not illustrated, a charge circuit that uses common drain terminal 39 as a path of a precharge current, and a discharge circuit that uses common drain terminal 39 as a path of a discharge current can be also configured.

In this way, the packaged semiconductor device according to an aspect of the present disclosure includes the aforementioned semiconductor device, that is, multi-transistor chip 1, and a package in which the semiconductor device is sealed and which has a first source external terminal, a first gate external terminal, a second source external terminal, a second gate external terminal, and a common drain external terminal. The first source external terminal, the first gate external terminal, the second source external terminal, the second gate external terminal, and the common drain external terminal of the package are electrically connected respectively to first source electrode 11, first gate electrode 19, second source electrode 21, second gate electrode 29, and backside electrode 31 of multi-transistor chip 1.

According to the configuration, the packaged semiconductor device is obtained, which has the multi-transistor chip excellent in reduction of the on resistance and suppression of chip warpage, has high durability against the environmental conditions, and can use the common drain external terminal in voltage monitor for the common drain of the first and second vertical MOS transistors in the multi-transistor chip, for example.

Although the semiconductor device according to one or a plurality of aspects of the present disclosure is described based on exemplary embodiments, the present disclosure is not limited to the embodiments. Forms obtained by applying various modifications to the present embodiments that may be conceived of by a person skilled in the art, and forms constructed by combining components in different embodiments, as long as the forms do not depart from the essence of the present disclosure, may be included in the scope of one or a plurality of aspects of the present disclosure.

INDUSTRIAL APPLICABILITY

A semiconductor device according to the present disclosure can be widely used in a power supply circuit, for example, as a CSP type multi-transistor chip.

What is claimed is:
1. A semiconductor device, comprising:
a semiconductor substrate that includes silicon and a first conductivity-type impurity;
a low-concentration impurity layer that is in contact with a front surface of the semiconductor substrate, and includes a first conductivity-type impurity having a concentration lower than a concentration of the first conductivity-type impurity in the semiconductor substrate;
a backside electrode that is in contact with a back surface of the semiconductor substrate, and includes a metal material;
a first vertical metal-oxide semiconductor (MOS) transistor that is located in a first region in the low-concentration impurity layer; and
a second vertical MOS transistor that is located in a second region adjacent to the first region in the low-concentration impurity layer in a plan view of the semiconductor substrate,
wherein the first vertical MOS transistor includes a first source electrode and a first gate electrode on a surface of the low-concentration impurity layer,
the second vertical MOS transistor includes a second source electrode and a second gate electrode on the surface of the low-concentration impurity layer,
the semiconductor substrate serves as a common drain region of a first drain region of the first vertical MOS transistor and a second drain region of the second vertical MOS transistor,
a thickness of the backside electrode ranges from 25 μm to 35 μm, inclusive, and
when a diagonal dimension in a plan view of the semiconductor substrate is set as L mm, a ratio of a thickness of the backside electrode to a thickness of a semiconductor layer including the semiconductor substrate and the low-concentration impurity layer is (−0.48×L+2.07) or more.

2. A semiconductor device, comprising:
a semiconductor substrate that includes silicon and a first conductivity-type impurity;
a low-concentration impurity layer that is in contact with a front surface of the semiconductor substrate, and includes a first conductivity-type impurity having a concentration lower than a concentration of the first conductivity-type impurity in the semiconductor substrate;
a backside electrode that is in contact with a back surface of the semiconductor substrate, and includes a metal material;
a first vertical metal-oxide semiconductor (MOS) transistor that is located in a first region in the low-concentration impurity layer; and
a second vertical MOS transistor that is located in a second region adjacent to the first region in the low-concentration impurity layer in a plan view of the semiconductor substrate,
wherein the first vertical MOS transistor includes a first source electrode and a first gate electrode on a surface of the low-concentration impurity layer,
the second vertical MOS transistor includes a second source electrode and a second gate electrode on the surface of the low-concentration impurity layer,
the semiconductor substrate serves as a common drain region of a first drain region of the first vertical MOS transistor and a second drain region of the second vertical MOS transistor,
a ratio of a thickness of the first source electrode to a thickness of the backside electrode is 0.28 or less, and
a ratio of a thickness of the second source electrode to the thickness of the backside electrode is 0.28 or less.

3. A semiconductor device, comprising:
a semiconductor substrate that includes silicon and a first conductivity-type impurity;
a low-concentration impurity layer that is in contact with a front surface of the semiconductor substrate, and includes a first conductivity-type impurity having a concentration lower than a concentration of the first conductivity-type impurity in the semiconductor substrate;
a backside electrode that is in contact with a back surface of the semiconductor substrate, and includes a metal material;
a first vertical metal-oxide semiconductor (MOS) transistor that is located in a first region in the low-concentration impurity layer; and
a second vertical MOS transistor that is located in a second region adjacent to the first region in the low-concentration impurity layer in a plan view of the semiconductor substrate,
wherein the first vertical MOS transistor includes a plurality of first source electrodes and a first gate electrode on a surface of the low-concentration impurity layer,
the second vertical MOS transistor includes a plurality of second source electrodes and a second gate electrode on the surface of the low-concentration impurity layer,
the semiconductor substrate serves as a common drain region of a first drain region of the first vertical MOS transistor and a second drain region of the second vertical MOS transistor, and
a third source electrode included in the plurality of the first source electrodes and a fourth source electrode included in the plurality of the second source electrodes are source electrodes disposed closest to a boundary between the first region and the second region, the third source electrode and the fourth source electrode extending along an entirety of the boundary.

4. The semiconductor device according to claim 3,
wherein an interval between the third source electrode and the fourth source electrode is narrower than a width of the third source electrode and narrower than a width of the fourth source electrode.

5. The semiconductor device according to claim 3,
wherein an interval between the third source electrode and the fourth source electrode is wider than a width of the third source electrode and wider than a width of the fourth source electrode.

6. A semiconductor device, comprising:
a semiconductor substrate that includes silicon and a first conductivity-type impurity;
a low-concentration impurity layer that is in contact with a front surface of the semiconductor substrate, and includes a first conductivity-type impurity having a concentration lower than a concentration of the first conductivity-type impurity in the semiconductor substrate;
a backside electrode that is in contact with a back surface of the semiconductor substrate, and includes a metal material;
a first vertical metal-oxide semiconductor (MOS) transistor that is located in a first region in the low-concentration impurity layer; and
a second vertical MOS transistor that is located in a second region adjacent to the first region in the low-concentration impurity layer in a plan view of the semiconductor substrate,
wherein the first vertical MOS transistor includes a first source electrode and a first gate electrode on a surface of the low-concentration impurity layer,
the second vertical MOS transistor includes a second source electrode and a second gate electrode on the surface of the low-concentration impurity layer,
the semiconductor substrate serves as a common drain region of a first drain region of the first vertical MOS transistor and a second drain region of the second vertical MOS transistor,
the first source electrode comprises, between (i) a boundary of the first region and the second region and (ii) a first opposite end which is an end of the first region that is opposite to the boundary, a plurality of first source electrodes aligned in a direction that crosses the boundary,
the first gate electrode is disposed at a position that is near a center of the first opposite end in a direction parallel to the boundary and between a pair of the plurality of first source electrodes in the direction parallel to the boundary,
a center point of the first gate electrode is disposed at a position that is offset toward the first opposite end from a boundary-side end of a first source electrode farthest from the boundary, in the first region, the boundary-side end being an end of the first source electrode that is closest to the boundary,
the second source electrode comprises, between the boundary and a second opposite end which is an end of the second region that is opposite to the boundary, a plurality of second source electrodes aligned in a direction that crosses the boundary, the second gate electrode is disposed at a position that is near a center of the second opposite end in a direction parallel to the boundary and between a pair of the plurality of second source electrodes in the direction parallel to the boundary, and a center point of the second gate electrode is disposed at a position that is offset toward the second opposite end from a boundary-side end of a second source electrode farthest from the boundary, in the second region, the boundary-side end being an end of the second source electrode that is closest to the boundary.

7. A semiconductor module, comprising:

a printed wiring board;

a wiring pattern that is provided in a strip shape on the printed wiring board, and is separated into a first section and a second section by a gap that crosses a longitudinal direction of the wiring pattern; and the semiconductor device according to claim 3 that is disposed on the gap, wherein the semiconductor device is disposed in an orientation in which the first region and the second region align in a longitudinal direction of the wiring pattern, and the first source electrode and the second source electrode are respectively connected to the first section and the second section of the wiring pattern.

* * * * *